United States Patent
Lee et al.

(10) Patent No.: US 8,741,761 B2
(45) Date of Patent: Jun. 3, 2014

(54) METHODS OF MANUFACTURING THREE-DIMENSIONAL SEMICONDUCTOR DEVICES

(75) Inventors: Jaegoo Lee, Hwasung (KR);
Byungkwan You, Hwasung (KR);
Youngwoo Park, Hwasung (KR);
Kwang Soo Seol, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 59 days.

(21) Appl. No.: 13/165,256

(22) Filed: Jun. 21, 2011

(65) Prior Publication Data

US 2011/0312174 A1 Dec. 22, 2011

(30) Foreign Application Priority Data

Jun. 22, 2010 (KR) ........................ 10-2010-0059150

(51) Int. Cl.
*H01L 23/3205* (2006.01)
*H01L 21/31* (2006.01)

(52) U.S. Cl.
USPC 438/595; 438/761; 257/E21.24; 257/E21.294

(58) Field of Classification Search
USPC .................................................. 438/595, 761
See application file for complete search history.

(56) References Cited

U.S. PATENT DOCUMENTS

| | | | |
|---|---|---|---|
| 7,807,583 B2 * | 10/2010 | Van Aelst et al. ............ | 438/717 |
| 7,847,342 B2 | 12/2010 | Fukuzumi et al. | |
| 8,187,932 B2 * | 5/2012 | Nguyen et al. ................ | 438/237 |
| 2007/0155119 A1 * | 7/2007 | Muemmler et al. .......... | 438/424 |
| 2009/0090965 A1 | 4/2009 | Kito et al. | |
| 2009/0146206 A1 | 6/2009 | Fukuzumi et al. | |
| 2010/0090317 A1 * | 4/2010 | Zimmermann et al. ...... | 257/621 |
| 2011/0121366 A1 * | 5/2011 | Or-Bach et al. ............... | 257/204 |
| 2011/0287612 A1 * | 11/2011 | Lee et al. ...................... | 438/478 |
| 2012/0028412 A1 * | 2/2012 | Jeong et al. ................... | 438/107 |
| 2012/0049268 A1 * | 3/2012 | Chang et al. .................. | 257/324 |
| 2012/0083077 A1 * | 4/2012 | Yang et al. .................... | 438/156 |
| 2012/0088367 A1 * | 4/2012 | Sekar et al. ................... | 438/694 |
| 2012/0091413 A1 * | 4/2012 | Nguyen et al. ................ | 257/2 |
| 2012/0119287 A1 * | 5/2012 | Park et al. ..................... | 257/329 |

FOREIGN PATENT DOCUMENTS

| | | |
|---|---|---|
| JP | 2009094214 A | 4/2009 |
| JP | 2009135324 A | 6/2009 |
| JP | 2009146942 A | 7/2009 |
| KR | 20090035450 A | 4/2009 |

* cited by examiner

*Primary Examiner* — Alexander Ghyka
(74) *Attorney, Agent, or Firm* — Harness, Dickey & Pierce, P.L.C.

(57) ABSTRACT

Methods of manufacturing three-dimensional semiconductor devices that may include forming a first spacer on a sidewall inside a first opening formed in a first stack structure, forming a sacrificial filling pattern on the spacer to fill the first opening, forming a second stack structure including a second opening exposing the sacrificial filling pattern on the first stack structure, forming a second spacer on a sidewall inside the second opening, removing the sacrificial filling pattern and removing the first spacer and the second spacer.

18 Claims, 29 Drawing Sheets

METHODS OF MANUFACTURING THREE-DIMENSIONAL SEMICONDUCTOR DEVICES

CROSS-REFERENCE TO RELATED APPLICATION

This U.S. non-provisional patent application claims priority under 35 U.S.C. §119 to Korean Patent Application No. 10-2010-0059150, filed on Jun. 22, 2010, in the Korean Intellectual Property Office (KIPO), the entire contents of which is incorporated herein by reference.

BACKGROUND

1. Field

Example embodiments of the inventive concepts relate to methods of manufacturing semiconductor devices, and more particularly, to methods of manufacturing three-dimensional semiconductor devices.

2. Description of the Related Art

A 3D-IC memory technique may be used for increasing a memory capacity. A 3D-IC memory technique refers generally to technologies related to arranging memory cells three-dimensionally (e.g., in more than one plane).

SUMMARY

Example embodiments of the inventive concepts may provide methods of manufacturing three-dimensional semiconductor devices resulting in improved device reliability and/or improved electrical characteristics.

Example embodiments of the inventive concepts may provide a method of forming a three-dimensional semiconductor device including forming a first stack structure on a substrate, forming a first opening passing through the first stack structure, forming a first spacer on a sidewall of the first opening, forming a sacrificial filling pattern filling the first opening, forming a second stack structure on the first stack structure, forming a second opening passing through the second stack structure to expose the sacrificial filling pattern, forming a second spacer on the sidewall of the second opening, removing the sacrificial filling pattern and removing the first spacer and the second spacer.

According to some example embodiments, the first spacer and the second spacer may include a material having an etch selectivity with respect to the sacrificial fill pattern. According to other example embodiments of the inventive concepts, a method of forming a three-dimensional semiconductor device may further include forming an etch stop layer on the second stack structure before the forming of the second opening. The second opening may continuously pass through the etch stop layer and the second stack structure. According to still other example embodiments, the etch stop layer may be the same material as at least one of the first spacer and the second spacer.

According to even other example embodiments, the first opening and the second opening may be formed in a trench shape extending in one direction. According to other example embodiments of the inventive concepts, a method of forming a three-dimensional semiconductor device may include forming a first active pattern passing through the first stack structure before the forming of the first opening, and forming a second active pattern passing through the second stack structure to contact the first active pattern before the forming of the second opening.

According to further example embodiments of the inventive concepts, a method of forming a three-dimensional semiconductor device may include forming empty regions between insulation layers by removing sacrificial layers exposed to the first and second openings after removing the first and second spacers, forming a data storage layer conformally on the inner surface of the empty regions and forming gate patterns filling the empty regions, respectively. The respective first and second stack structures may include the insulation layers and the sacrificial layers stacked alternately and repeatedly, and the insulation layers and the sacrificial layers may be formed of materials having an etch selectivity to each other. According to further example embodiments, the first spacer and the second spacer may be formed of a material having an etch selectivity with respect to the insulation layers.

According to even further example embodiments of the inventive concepts, a method of forming a three-dimensional semiconductor device may include forming a first through-hole passing through the first stack structure before the forming of the second stack structure, forming a first hole spacer on a sidewall of the first through-hole, forming a hole fill pattern filling the first through-hole having the first hole spacer, forming a second through-hole passing through the second stack structure to expose the hole fill pattern after forming the second stack structure, forming a second hole spacer on a sidewall of the second through-hole, removing the first hole spacer to expose the exposed hole fill pattern, removing the first hole spacer and the second hole spacer and forming an active pattern in the first through-hole and the second through-hole. The first through-hole and the first opening may be spaced apart laterally from each other, and the first through-hole and the second opening may also be spaced apart laterally from each other.

According to yet further example embodiments, the first hole spacer and the second hole spacer may have an etch selectivity with respect to the insulation layers and the sacrificial layers. According to much further example embodiments, the first opening and the first through-hole may be formed at the same time. According to still much further example embodiments of the inventive concepts, a method of forming a three-dimensional semiconductor device may include forming an active pattern in the first and second opening after the removing of the first and second spacers. The first opening may be formed in a hole shape in the first stack structure and the second opening may be formed in a hole shape in the second stack structure.

According to one or more example embodiments, a method of manufacturing a three-dimensional semiconductor device includes forming a first stack structure on a substrate, forming a first opening passing through the first stack structure, forming a first spacer on a sidewall of the first stack structure inside the first opening, forming a sacrificial filling pattern to fill the first opening, forming a second stack structure on the first stack structure, forming a second opening passing through the second stack structure to expose the sacrificial filling pattern, forming a second spacer on a sidewall of the second stack structure inside the second opening, removing the sacrificial filling pattern and removing the first and second spacers.

According to one or more example embodiments, a method of manufacturing a three-dimensional semiconductor device may include depositing a first plurality of layers on a semiconductor layer, the first plurality of layers including a first layer and a second layer, removing a portion of the first and second layers to form a single first sidewall, depositing a first spacer on the first sidewall, depositing a sacrificial layer on the first spacer such that an exposed surface of the plurality of layers is contiguous, depositing a second plurality of layers on the first plurality of layers, the second plurality of layers including a third layer and a fourth layer, removing a portion of the third and fourth layers to form a single second sidewall and to expose the sacrificial layer, depositing a second spacer on the second sidewall, removing the sacrificial layer and removing the first and second spacers

BRIEF DESCRIPTION OF THE DRAWINGS

Example embodiments will be more clearly understood from the following brief description taken in conjunction with the accompanying drawings. FIGS. 1-32 represent non-limiting, example embodiments as described herein.

FIGS. 1-12 are cross-sectional diagrams illustrating methods of manufacturing three-dimensional semiconductor devices according to example embodiments of the inventive concepts;

FIG. 14 is a cross-sectional diagram illustrating an example active pattern in a three-dimensional semiconductor device according to example embodiments of the inventive concepts;

FIGS. 15-28 are cross-sectional diagrams illustrating methods of manufacturing three-dimensional semiconductor devices according to example embodiments of the inventive concepts;

FIG. 29 is a cross-sectional diagram illustrating an example active pattern in a three-dimensional semiconductor device according to example embodiments of the inventive concepts;

FIG. 30 is a schematic block diagram illustrating example electronic systems including three-dimensional semiconductor devices manufactured according to example embodiments of the inventive concepts;

FIG. 31 is a schematic block diagram illustrating example memory cards including three-dimensional semiconductor devices manufactured according to example embodiments of the inventive concepts; and FIG. 32 is a schematic block diagram illustrating example data processing systems mounting three-dimensional semiconductor devices manufactured according to example embodiments of the inventive concepts.

Figure 1:
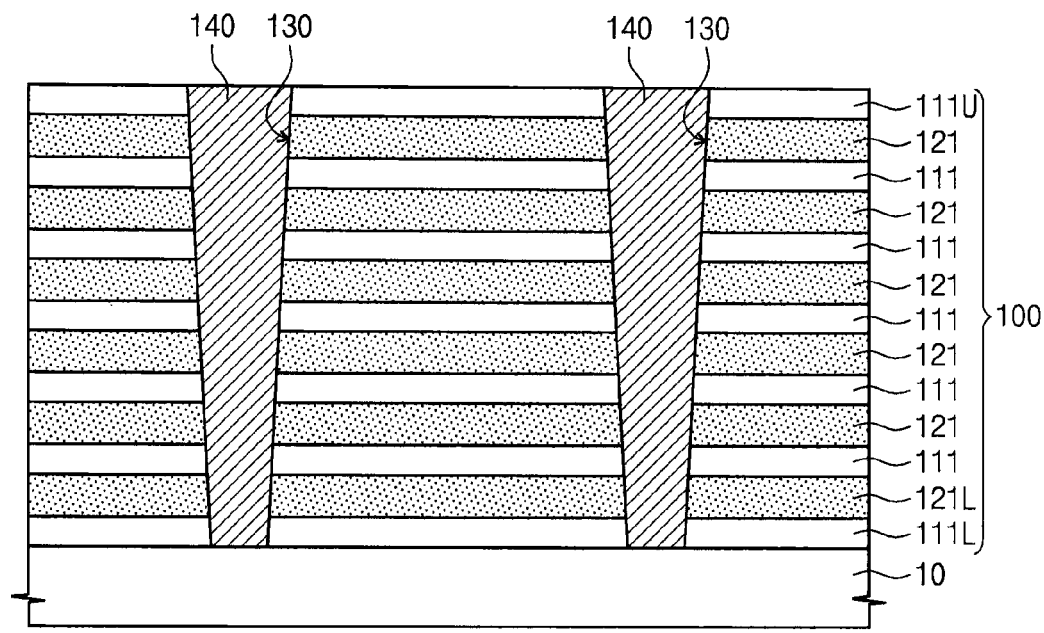

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments of the inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of the inventive concepts. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments of the inventive concepts.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In the case of typical two-dimensional or planar semiconductor devices, integration density may be mainly determined by the area occupied by a unit memory cell. Ways of making patterns finer as a method for increasing integration of semiconductor devices may require ultra-expensive equipment and may result in increased manufacturing costs. A desired degree of pattern miniaturization may not be achieved even with ultra-expensive equipment due to the constraints of semiconductor manufacturing processes.

Three-dimensional semiconductor devices with memory cells arranged three-dimensionally may be a viable alternative to planar devices. Three-dimensional semiconductor devices that are able to deliver improved reliability and electrical characteristics may be of interest.

FIGS. 1-12 are cross-sectional diagrams illustrating methods of manufacturing three-dimensional semiconductor devices according to example embodiments of the inventive concepts. Referring to FIG. 1, a first stack structure 100 may be formed on a substrate 10. The substrate 10 may be formed of a semiconducting material. For example, the substrate 10 may be a silicon substrate, a silicon-germanium substrate and/or a germanium substrate. The substrate 10 may include a conductive pattern (not shown). The conductive pattern (not shown) may be a layer and/or a pattern disposed on the substrate 10. The conductive pattern (not shown) may be a doped region formed in the substrate 10.

The first stack structure 100 may be formed by alternately and repeatedly stacking first insulation layers 111L, 111 and 111U and first sacrificial layers 121 and 121L (e.g., alternating first insulation layers with first sacrificial layers as illustrated in FIG. 1). The first sacrificial layers 121 and 121L may be formed of a material with etch selectivity to the first insulation layers 111L, 111 and 111U. For example, according to one or more example embodiments in which the first insulation layers 111L, 111 and 111U include a silicon oxide, each of the first sacrificial layers 121 and 121L may include, for example, a silicon nitride, a silicon oxynitride, a silicon carbide, and/or silicon. According to one or more example embodiments in which the first insulation layers 111L, 111 and 111U include a silicon nitride, each of the first sacrificial layers 121 and 121L may include, for example, a silicon oxide, a silicon oxynitride, a silicon carbide, and/or silicon. Example embodiments of the inventive concepts are not limited thereto. The first insulation layers 111L, 111 and 111U may be formed of different insulation materials, and each of the first sacrificial layers 121 and 121L may be formed of a material that is different from a material of the first insulation layers 111L, 111 and 111U.

The first insulation layers 111L, 111 and 111U may be formed to the same or different thicknesses with respect to each other. According to example embodiments, the uppermost first insulation layer 111U of the first insulation layers 111L, 111 and 111U may be thicker than the first insulation layers 111 and thicker than the lowermost first insulation layer 111L. The respective first insulation layers 111 between the lowermost and uppermost first insulation layers 111L and 111U may be, for example, the same thickness. The lowermost first insulation layer 111L may be, for example, a thickness equal to or smaller than the thickness of the first insulation layers 111. The first sacrificial layers 121 and 121L may be formed to the same or different thicknesses with respect to each other. According to example embodiments, the lowermost first sacrificial layer 121L of the first sacrificial layers 121 and 121L may be thicker than the first sacrificial layers 121 on the lowermost first sacrificial layer 121L. The first sacrificial layers 121 on the lowermost first sacrificial layer 121L may be, for example, the same thickness.

A first through-hole 130 passing through the first stack structure 100 may be formed by patterning the first stack structure 100. A plurality of the first through-holes 130 may be formed in the first stack structure 100. The first through-holes 130 may be laterally spaced apart from each other. When viewed from the top, the first through-holes 130 may be arranged two-dimensionally in various forms. The first through-hole 130 may be formed to expose a portion of the upper surface of the substrate 10. The first through-hole 130 may be formed in a downward tapered shape (e.g., as illustrated in the drawings). The first through-hole 130 may be formed with a smaller width at the lower portion closer to the substrate 10 than the upper portion.

A first active pattern 140 filling the respective first through-holes 130 may be formed. Because the first active pattern 140 may be formed using the first through-hole 130 as a mold, the lower surface of the first active pattern 140 may be in contact with the substrate 10. The first active pattern 140 may be formed in a downward tapered shape. The first active pattern 140 may be formed of a semiconducting material. For example, the first active pattern 140 may include silicon, and the crystal structure of the first active pattern 140 may be polycrystalline, single crystalline and/or amorphous. The first active pattern 140 may be formed, for example, by epitaxial technology, an atomic layer deposition process and/or a chemical vapor deposition process.

Figure 2:
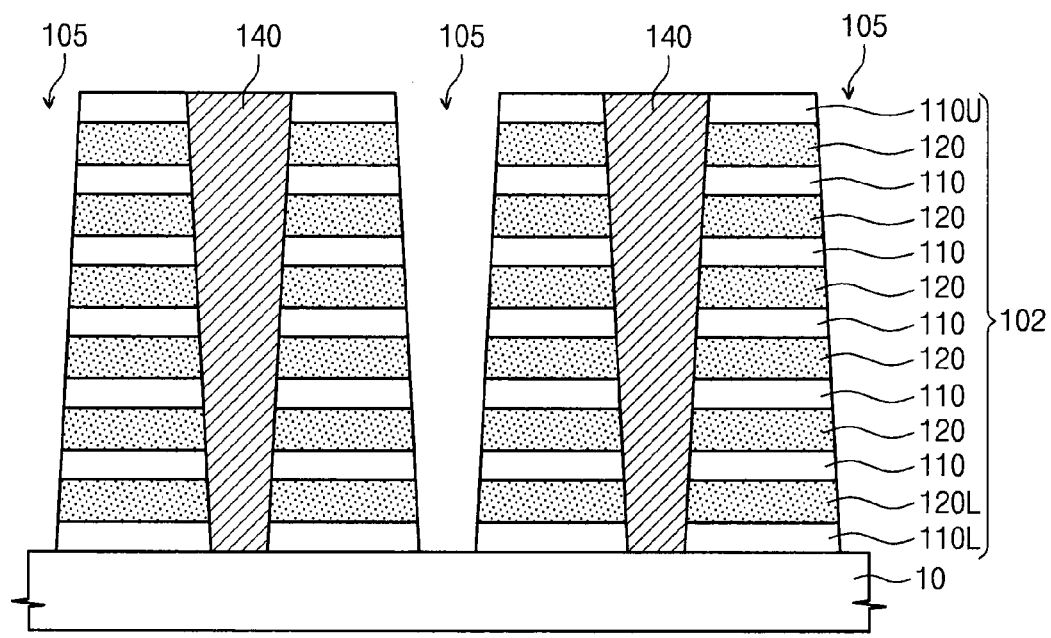

Referring to FIG. 2, a first trench 105 may be formed by patterning the first stack structure 100. The first trench 105 may define a first stack pattern 102, which may be formed to include a portion of the first stack structure 100 by patterning the first stack structure 100. The first stack pattern 102 may include first insulation patterns 110L, 110 and 110U and first sacrificial patterns 120 and 120L stacked alternately and repeatedly. The first insulation patterns 110L, 110 and 110U may be formed to include a portion of the first insulation layers 111L, 111 and 111U, and the first sacrificial patterns 120 and 120L may be formed to include a portion of the first sacrificial layers 121 and 121L. The first active pattern 140 may be in the first stack pattern 102. The first trench 105 and the first active pattern 140 may be spaced apart laterally from each other. Forming the first trench 105 may include, for example, forming a mask pattern (not shown) to define the position of the first trench 105 and etching the first stack structure 100 using the mask pattern as an etch mask. The etching of the first stack structure 100 may be performed by, for example, an anisotropic etch process. The first trench 105 may be formed in a downward tapered shape (e.g., as illustrated in the drawings).

The first trench 105 may pass through the first stack structure 100 to expose a portion of the upper surface of the substrate 10. Both sidewalls of the first trench 105 may be defined by the sidewalls of one pair of adjacent first stack patterns 102. The sidewalls of the first insulation patterns 110L, 110 and 110U and the first sacrificial patterns 120 and 120L may be exposed by the first trench 105. The lower surface of the first trench 105 may be defined by a portion of the upper surface of the substrate 10 exposed by the first trench 105.

Figure 3:
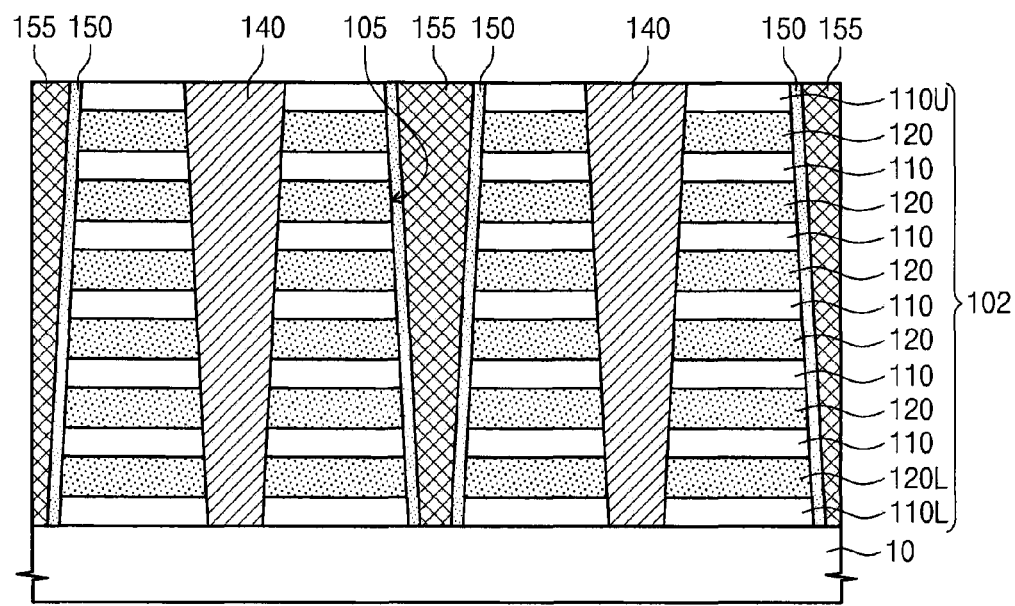

Referring to FIG. 3, a first spacer 150 may be formed on a sidewall of the first trench 105. A sacrificial filling pattern 155 filling the first trench 105 may be formed. The first spacer 150 may be formed of a material with etch selectivity to the sacrificial filling pattern 155. The first spacer 150 may be formed of a material with etch selectivity to the first insulation patterns 110L, 110 and 110U. For example, according to one or more example embodiments in which the sacrificial filling pattern 155 and the first insulation patterns 110L, 110 and 110U include a silicon oxide, the first spacer 150 may include, for example, silicon, a silicon nitride, a silicon oxynitride and/or a silicon carbide. Example embodiments of the inventive concepts are not limited thereto. The sacrificial filling pattern 155 and the first insulation patterns 110L, 110 and 110U may be formed of a material that is different from the materials described above, and the first spacer 150 may be formed of a material that is different from the sacrificial filling pattern 155 and the first insulation patterns 110L, 110 and 110U. The first spacer 150 may be formed of the same material as the first sacrificial patterns 120 and 120L.

According to example embodiments, the first spacer 150 may be of a material with etch selectivity to the first sacrificial patterns 120 and 120L. The first spacer 150 may be formed of a material with etch selectivity to the sacrificial filling pattern 155, the first insulation patterns 110L, 110 and 110U, and the first sacrificial patterns 120 and 120L. For example, the sacrificial filling pattern 155 and the first insulation patterns 110L, 110 and 110U may include a silicon oxide, the first sacrificial patterns 120 and 120L may include silicon nitride, and the first spacer 150 may include polysilicon.

The first spacer 150 may be formed to cover sidewalls of the first trench 105. The sacrificial filling pattern 155 may fill the inside of the first trench 105 on which the first spacer 150 is formed. The sidewall of the sacrificial filling pattern 155 may be in contact with the first spacer 150, and the lower surface of the sacrificial filling pattern 155 may be in contact with the upper surface of the substrate 10 exposed by the first trench 105. Forming the sacrificial filling pattern 155 may include forming a sacrificial filling layer (not shown) on the first stack pattern 102 and the first trench 105, and removing the sacrificial filling layer on the first stack pattern 102. Forming the sacrificial filling layer may be performed by, for example, a chemical vapor deposition process. Forming the sacrificial filling pattern 155 by removing the sacrificial filling layer on the first stack pattern 102 may be performed by, for example, an etch-back process and/or a chemical mechanical polishing process.

After forming the first through-hole 130 and the first active pattern 140, the first trench 105, the first spacer 150 and the sacrificial filling pattern 155 may be formed. According to example embodiments, after forming the first trench 105, the first spacer 150, the sacrificial filling pattern 155, the first through-hole 130 and the first active pattern 140 may be formed.

Figure 4:
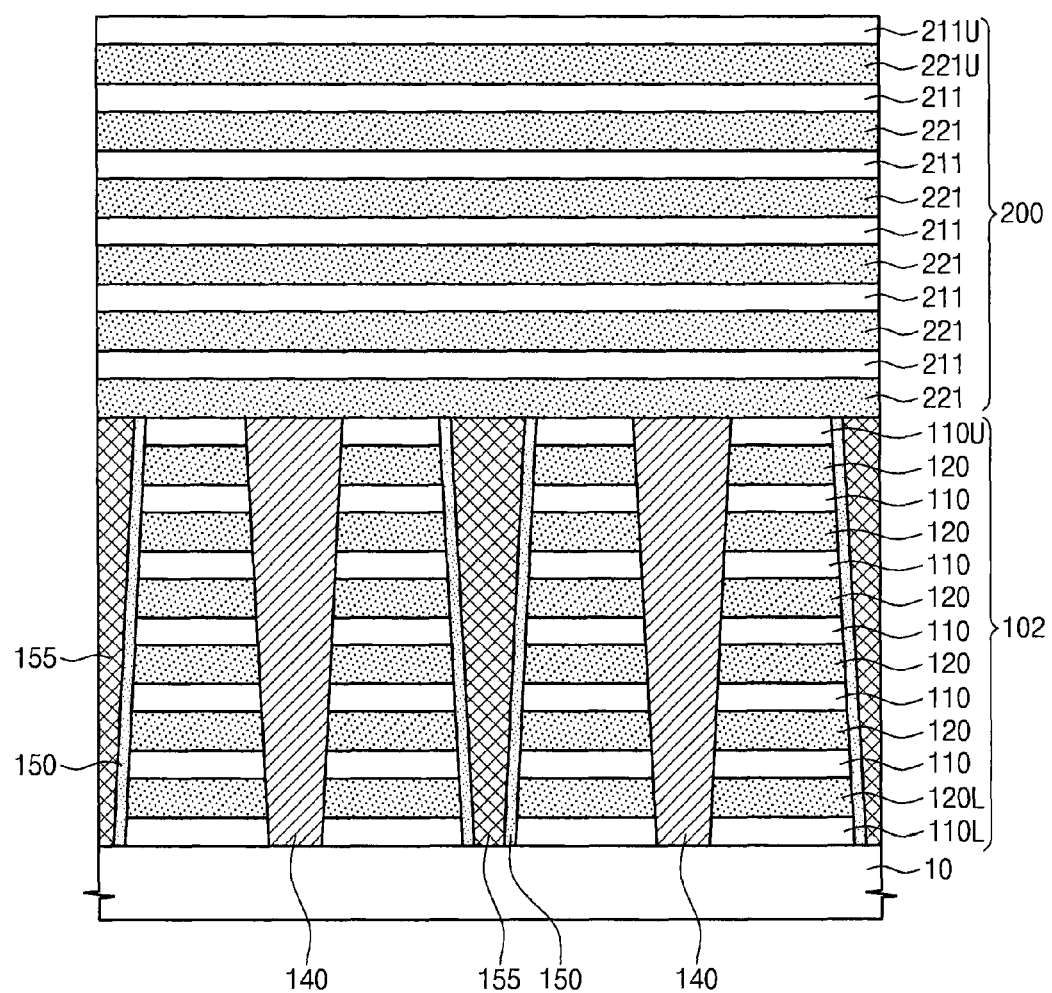

Referring to FIG. 4, a second stack structure 200 may be formed on the sacrificial filling pattern 155 and the first stack pattern 102. The second stack structure 200 may be formed by alternately and repeatedly stacking second insulation layers 211 and 211U, and second sacrificial layers 221 and 221U. The second sacrificial layers 221 and 221U may be formed of a material with etch selectivity to the second insulation layers 211 and 211U. For example, according to one or more example embodiments in which the second insulation layers 211 and 211U include a silicon oxide, the second sacrificial layers 221 and 221U may include, for example, silicon, a silicon nitride, a silicon carbide, and/or a silicon oxynitride. According to one or more example embodiments in which the second insulation layers 211 and 211U include a silicon nitride, the second sacrificial layers 221 and 221U may include, for example, silicon, silicon oxide, silicon carbide, and/or silicon oxynitride. Example embodiments of the inventive concepts are not limited thereto. The second insulation layers 211 and 211U may be formed of different insulation materials, and the respective second sacrificial layers 221 and 221U may be formed of a material different from the second insulation layers 211 and 211U. The second insulation layers 211 and 211U may be formed of the same material as the first insulation layers 111L, 111 and 111U, and the second sacrificial layers 221 and 221U may be formed of the same material as the first sacrificial layers 121 and 121L.

The second insulation layers 211 and 211U may be formed to the same or different thicknesses. The uppermost second insulation layer 211U of the second insulation layers 211 and 211U may be thicker than the second insulation layers 211 below the uppermost second insulation layer 211U. The second insulation layers 211 below the uppermost second insulation layer 211U may be the same thickness. The second sacrificial layers 221 and 221U may be formed to the same or different thicknesses with respect to each other. The uppermost second sacrificial layer 221U among the second sacrificial layers 221 and 221U may be thicker than second sacrificial layers 221 below the uppermost second sacrificial layer 221U. The second sacrificial layers 221 below the uppermost second sacrificial layer 221U may be the same thickness.

Figure 5:
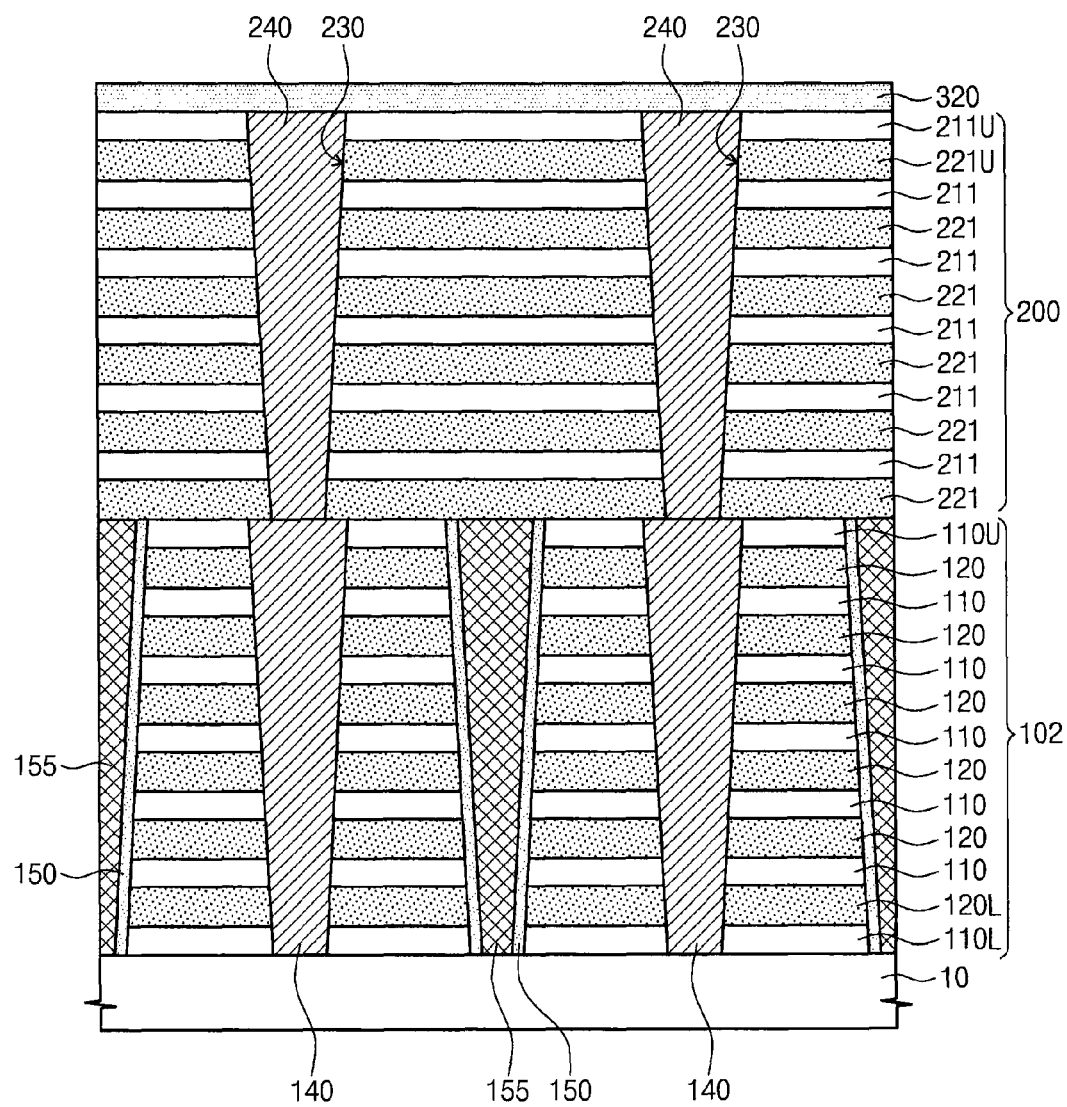

Referring to FIG. 5, a second through-hole 230 passing through the second stack structure 200 may be formed to expose the upper surface of the first active pattern 140. The second through-hole 230 may be formed in a downward tapered shape (e.g., as illustrated in the drawings). The second through-hole 230 may be arranged two-dimensionally in various forms. A second active pattern 240 filling the second through-hole 230 may be formed. A plurality of the second active patterns 240 may be in contact with a plurality of the first active patterns 140, respectively. The second active pattern 240 may be formed of a semiconducting material. For example, the second active pattern 240 may include silicon, and the crystal structure of the silicon may be polycrystalline, single crystalline and/or amorphous. The second active pattern 240 may be of the same material as the first active pattern 140, and with the same crystal structure. Forming the second active pattern 240 may be performed by, for example, epitaxial technology, an atomic layer deposition process and/or a chemical vapor deposition process.

An etch stop layer 320 may be formed on the second stack structure 200. The etch stop layer 320 may be formed of a material with etch selectivity to the sacrificial filling pattern 155. For example, according to one or more example embodiments in which the sacrificial filling pattern 155 includes a silicon oxide, the etch stop layer 320 may include, for example, silicon, a silicon oxynitride, a silicon carbide, and/or a silicon nitride. Example embodiments of the inventive concepts are not limited thereto. The sacrificial filling pattern 155 may be formed of a different material than described above, and the etch stop layer 320 may be formed of a material different from the sacrificial filling pattern 155. The etch stop layer 320 may be formed of the same material as the first spacer 150. According to one or more example embodiments the etch stop layer 320 may be omitted.

Figure 6:
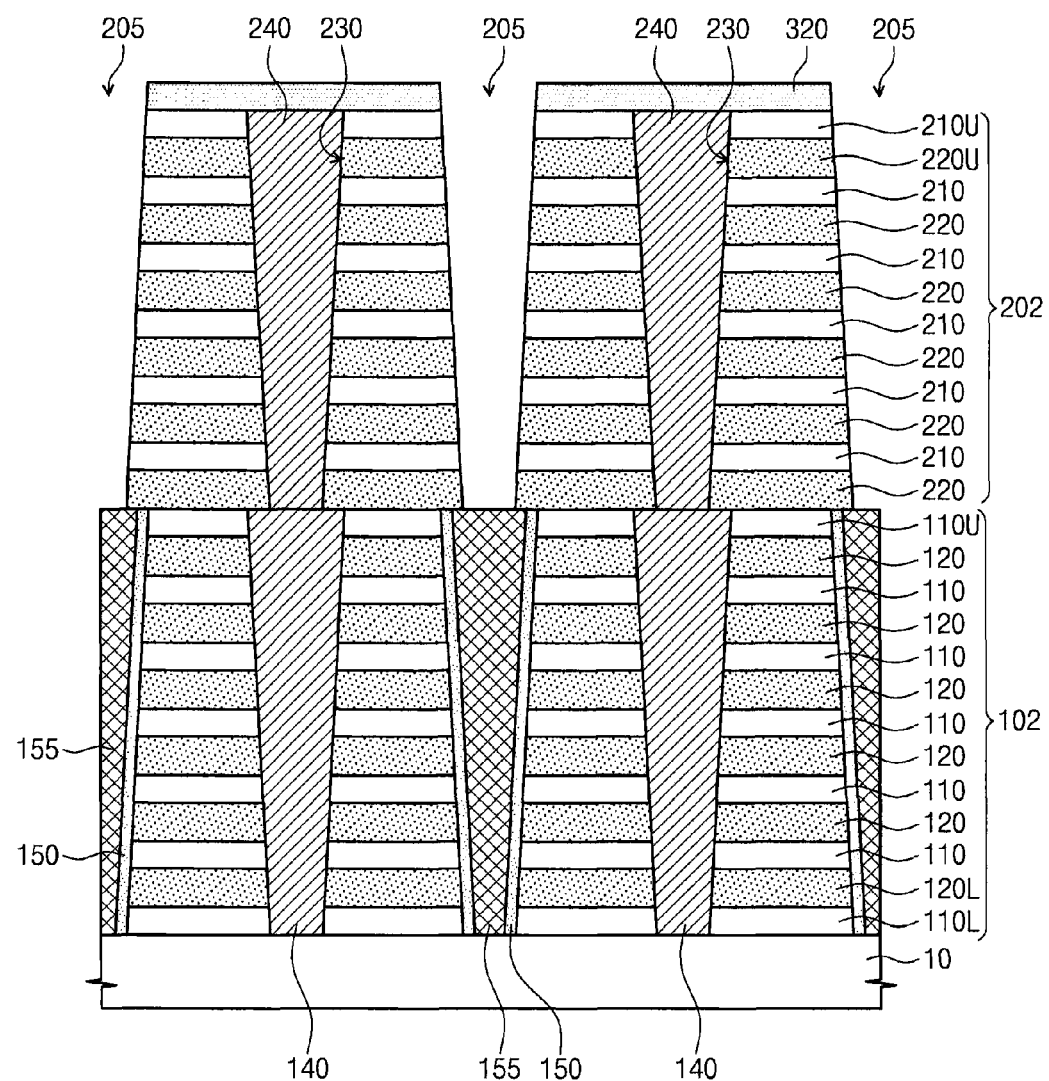

Referring to FIG. 6, a second trench 205 may be formed by patterning the etch stop layer 320 and the second stack structure 200 (e.g., by continuous patterning). The second trench 205 may define a second stack pattern 202 which may include a portion of the second stack structure 200. The second stack pattern 202 may include second insulation patterns 210 and 210U and second sacrificial patterns 220 and 220U stacked alternately and repeatedly. The second insulation patterns 210 and 210U may include a portion of the second insulation layers 211 and 211U, and the second sacrificial patterns 220 and 220U may include a portion of the second sacrificial layers 221 and 221U. The second trench 205 may be formed in a downward tapered shape (e.g., as illustrated in the drawings). The second trench 205 may expose the sacrificial filling pattern 155 filling the first trench 105. The sidewall of the second trench 205 may correspond to the sidewall of the second stack pattern 202.

Figure 7:
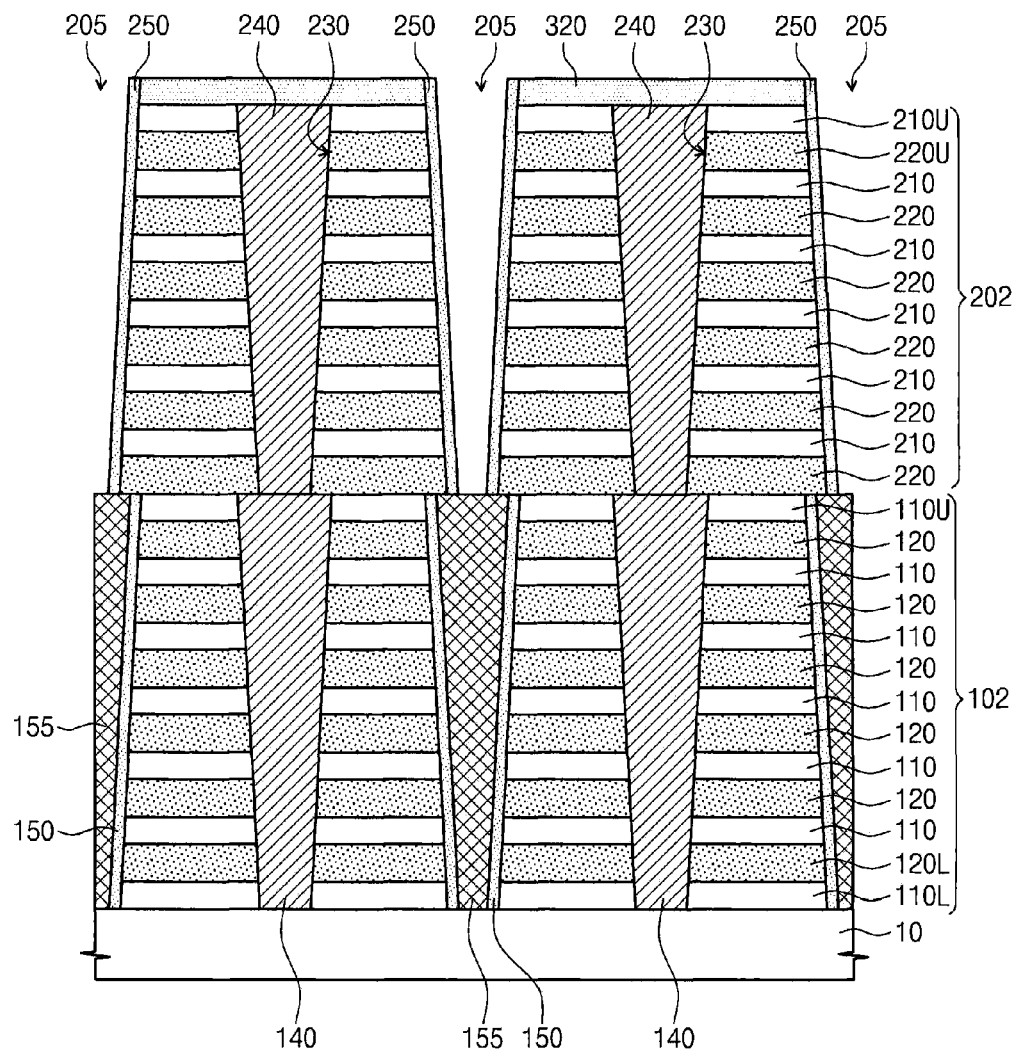

Referring to FIG. 7, a second spacer 250 may be formed on the sidewall of the second trench 205. The second spacer 250 may be formed of a material with etch selectivity to the sacrificial filling pattern 155. The second spacer 250 may be formed of a material with etch selectivity to the first and second insulation patterns 110L, 110, 110U, 210 and 210U. For example, according to one or more example embodiments in which the sacrificial filling pattern 155 and the first and second insulation patterns 110L, 110, 110U, 210 and 210U include a silicon oxide, the second spacer 250 may include, for example, a silicon oxynitride, a silicon carbide, silicon and/or a silicon nitride. Example embodiments of the inventive concepts are not limited thereto. The sacrificial filling pattern 155 and the first and second insulation patterns 110L, 110, 110U, 210 and 210U may be formed of a different material than described above, and the second spacer 250 may be formed of a material different from the sacrificial filling pattern 155 and the first and second insulation patterns 110L, 110, 110U, 210 and 210U. The second spacer 250 may be formed of the same material as the first spacer 150. The second spacer 250 may formed of the same material as the first and second sacrificial patterns 120, 120L, 220 and 220U.

According to example embodiments, the second spacer 250 may be formed of a material with etch selectivity to the first and second sacrificial patterns 120, 120L, 220 and 220U. The second spacer 250 may be formed of a material with etch selectivity to the first and second insulation patterns 110L, 110, 110U, 210 and 210U, the sacrificial filling pattern 155 and the first and second sacrificial patterns 120, 120L, 220 and 220U. For example, the sacrificial filling pattern 155 and the first and second insulation patterns 110L, 110, 110U, 210 and 210U may include a silicon oxide, the first and second sacrificial patterns 120, 120L, 220 and 220U may include a silicon nitride, and the second spacer 250 may include a polysilicon. The second spacer 250 may be formed by conformally forming a second spacer layer (not shown) on the upper surface of the second stack pattern 202 and inside of the second trench 205, and performing, for example, an anisotropic etch of the second spacer layer until the sacrificial filling pattern 155 is exposed.

Figure 8:
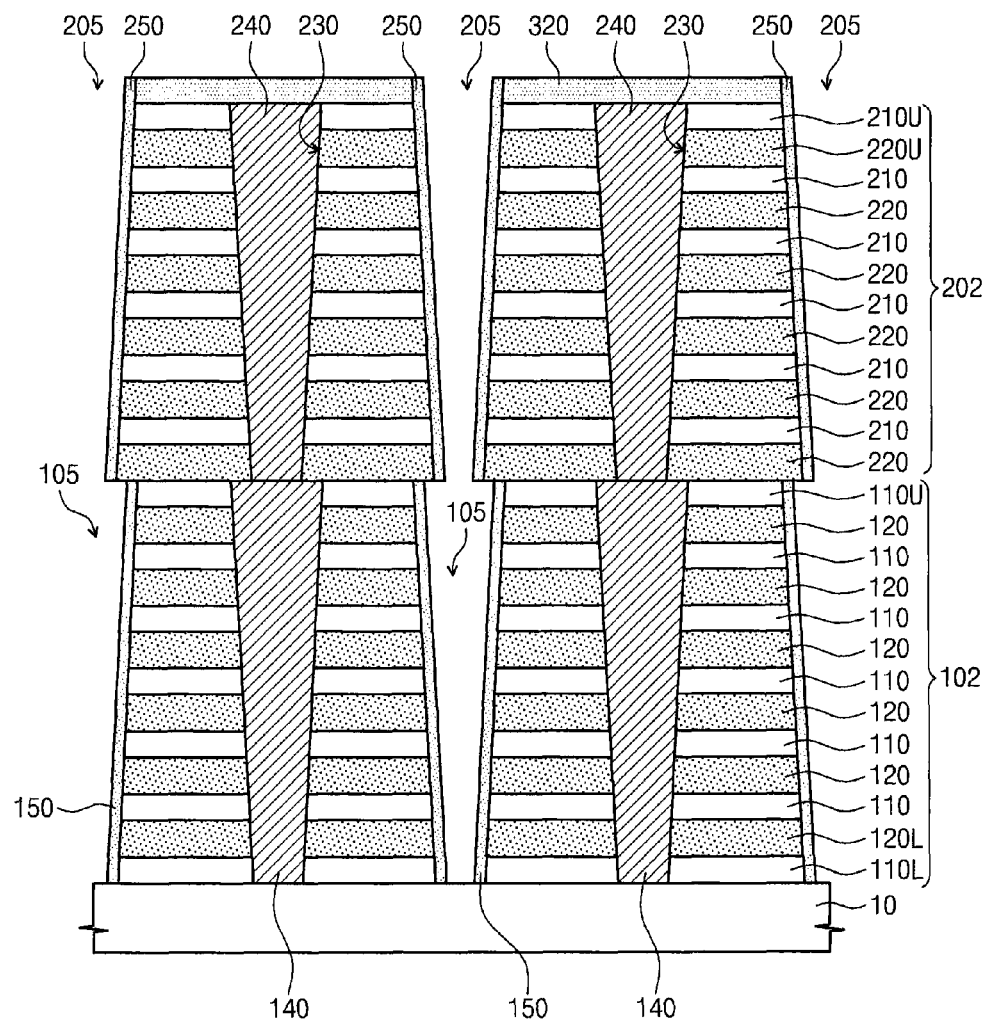

Referring to FIG. 8, the exposed sacrificial filling pattern 155 may be removed. The first and second spacers 150 and 250 may be formed of materials with etch selectivity to the sacrificial filling pattern 155 such that the first and second spacers 150 and 250 are not removed by an etch of the sacrificial pattern 155. The sidewalls of the first and second trenches 105 and 205 (e.g., the side surfaces of the first and second stack patterns 102 and 202) may be protected. The shape of the first and second stack patterns 102 and 202 may be maintained. The sacrificial filling pattern 155 may be removed by an isotropic etch process (e.g., wet etching and/or dry isotropic etching). The etch stop layer 320 may prevent and/or reduce etch damage of the second insulation pattern 210U of the uppermost second stack pattern 202 during the removal process of the sacrificial filling pattern 155.

Figure 9:
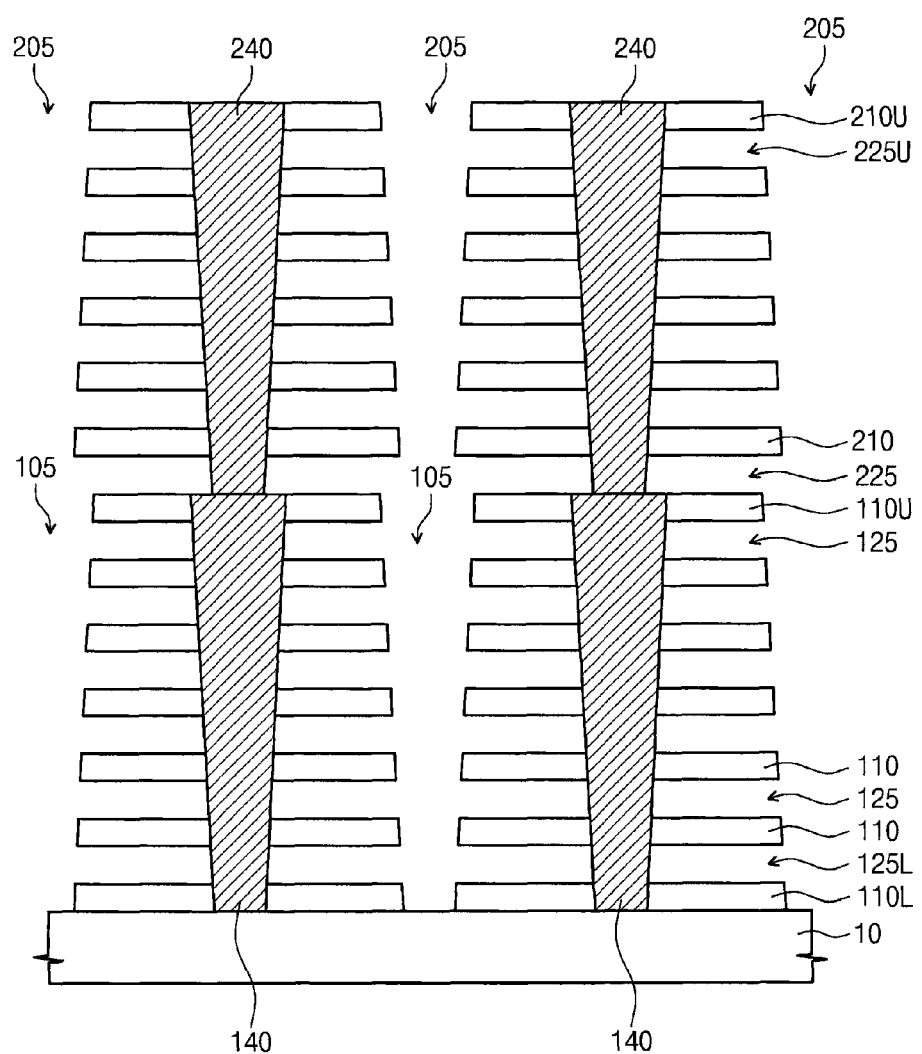

Referring to FIG. 9, the first and second spacers 150 and 250, and the first and second sacrificial patterns 120, 120L, 220 and 220U may be selectively removed to form first and second empty regions 125, 125L, 225, 225U. The first empty regions 125 and 125L may horizontally extend from the first trench 105 such that the sidewall of the first active pattern 140 may be exposed. The second empty regions 225 and 225U may horizontally extend from the second trench 205 such that the sidewall of the second active pattern 240 may exposed. The etch stop layer 320 may be removed during the etch of the first and second spacers 150 and 250 (e.g., by the same etch process). Removal of the first and second spacers 150 and 250, and removal of the first and second sacrificial patterns 120, 120L, 220 and 220U may be sequentially performed by different processes, respectively. Example embodiments of the inventive concepts are not limited thereto. For example, removal of the first and second spacers 150 and 250 and removal of the first and second sacrificial patterns 120, 120L, 220 and 220U may be performed by one etch process.

The first and second spacers 150 and 250 and the first and second sacrificial patterns 120, 120L, 220 and 220U may be removed by an isotropic etching process. For example, according to one or more example embodiments in which the first and second spacers 150 and 250 and the first and second sacrificial patterns 120, 120L, 220 and 220U are silicon nitride and the first insulation patterns 110L, 110 and 110U and the second insulation patterns 210 and 210U are silicon oxide, the isotropic etching process may be performed using an etch solution containing phosphoric acid. When the first and second spacers 150 and 250 and the first and second sacrificial patterns 120, 120L, 220 and 220U are removed, the first and second insulation patterns 110L, 110, 110U, 210 and 210U may remain.

Figure 10:
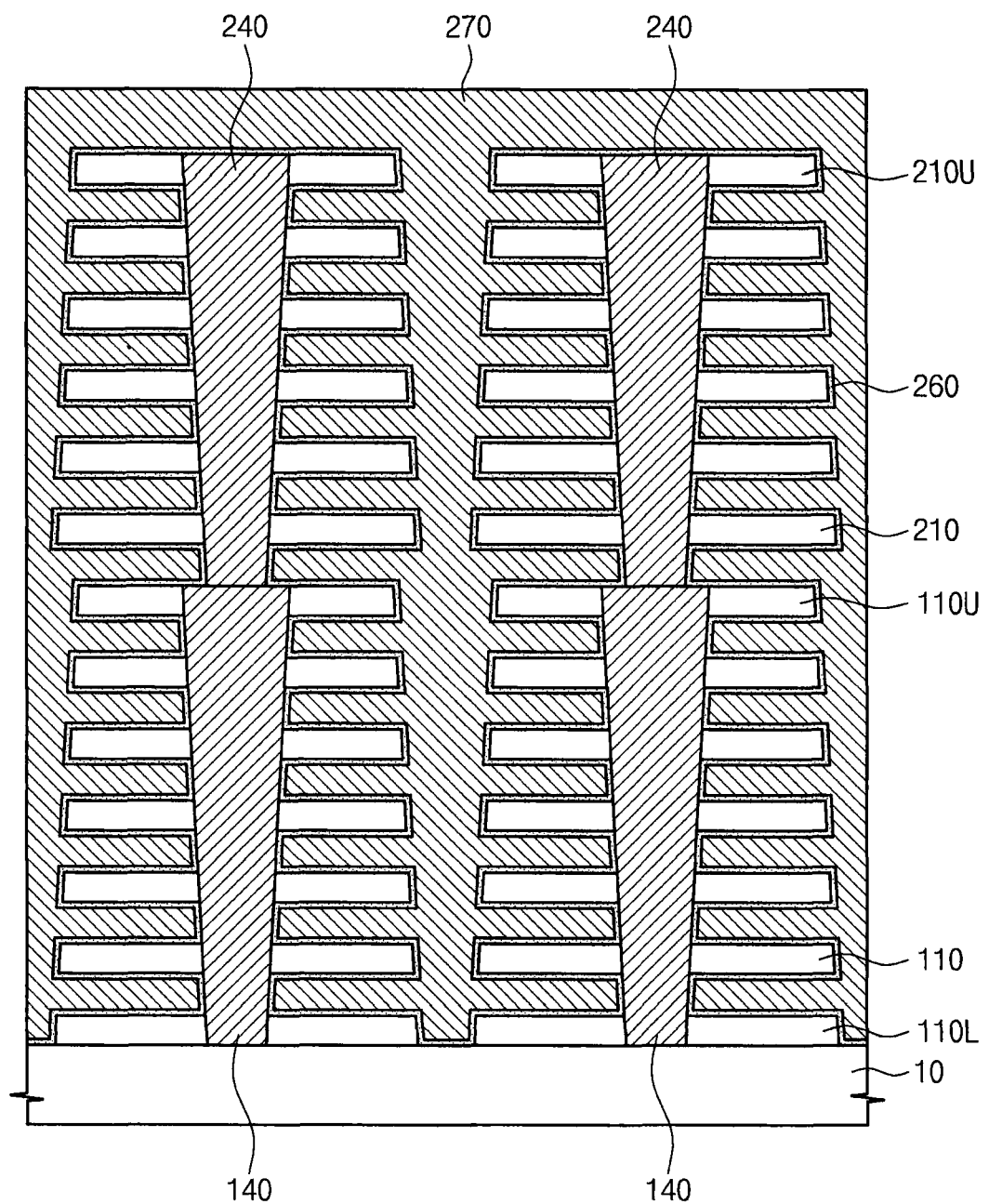

Referring to FIG. 10, a data storage layer 260 may be formed inside the first and second empty regions 125, 125L, 225 and 225U, on the exposed surfaces of the first and second insulation patterns 110L, 110, 110U, 210 and 210U, and the first and second active patterns 140 and 240. A conductive layer 270 may be formed to fill the inside of the first and second empty regions 125, 125L, 225 and 225U and the inside of the first and second trenches 105 and 205. The data storage layer 260 may be formed using, for example, a deposition technology capable of providing step coverage. For example, the data storage layer 260 may be formed by a chemical vapor deposition process and/or an atomic layer deposition process. The data storage layer 260 may include, for example, a tunnel dielectric layer, a charge storage layer and a blocking dielectric layer.

The charge storage layer may include a dielectric layer having deep-level traps capable of storing charges. For example, the charge storage layer may include nitride and/or insulating metal oxides (e.g., aluminum oxide and/or hafnium oxide). The tunnel dielectric layer may include, for example, a thermal oxide. The tunnel dielectric layer may be formed as a single layer and/or multilayer. For example, the tunnel dielectric layer may be formed to include a silicon oxide, a silicon oxynitride and/or a silicon nitride. The blocking dielectric layer may be formed as a single layer or a multilayer. For example, the blocking dielectric layer may include a silicon oxide and/or one or more high dielectric materials. High dielectrics may refer to dielectric materials with a higher dielectric constant than a tunnel dielectric layer. High dielectrics may include insulating metal oxides, for example, aluminum oxide and/or hafnium oxide.

The conductive layer 270 may be formed to fill the first and second empty regions 125, 125L, 225 and 225U, and the first and second trenches 105 and 205 covered by the data storage layer 260. The conductive layer 270 may include, for example, doped silicon, tungsten, one or more conductive metal nitrides and/or one or more metal silicides.

Figure 11:
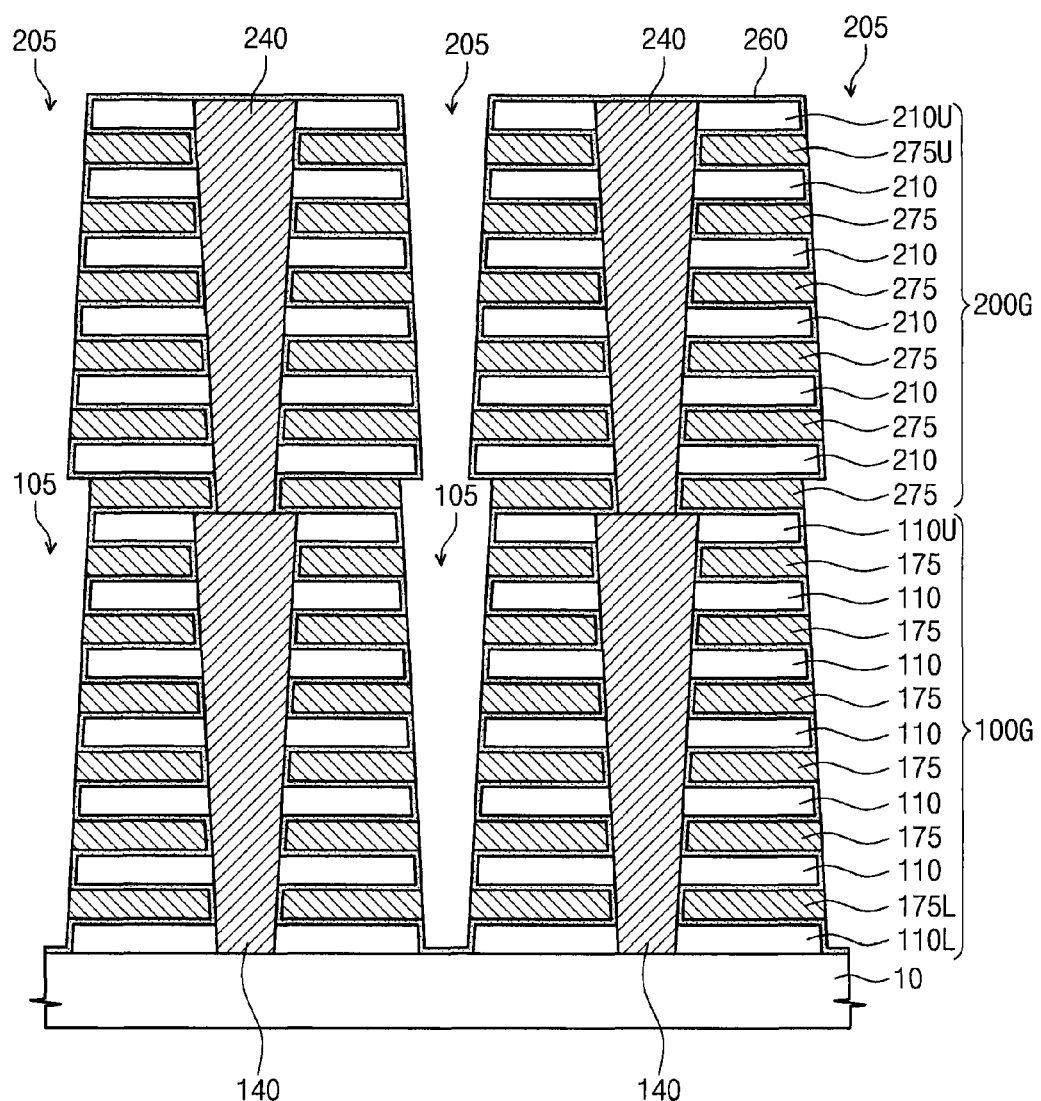

Referring to FIG. 11, the conductive layer 270 outside of the first and second empty regions 125, 125L, 225 and 225U may be removed such that first and second gate patterns 175, 175L, 275 and 275U, are formed in the first and second empty regions 125, 125L, 225 and 225U. The first gate patterns 175 and 175L may be formed in the first empty regions 125 and 125L, respectively, and the second gate patterns 275 and 275U may be formed in the second empty regions 225 and 225U, respectively. The sidewalls of the first and second gate patterns 175, 175L, 275 and 275U may be laterally recessed relative to the first and second insulation patterns 110L, 110, 110U, 210 and 210U. The conductive layer 270 outside of the first and second empty regions 125, 125L, 225 and 225U may be removed by one or a plurality of processes (e.g., a planarization process, an isotropic etch process and/or an anisotropic etch process).

A first gate structural body 100G may include the alternately and repeatedly stacked first insulation patterns 110L, 110 and 110U and the first gate patterns 175 and 175L. The first active pattern 140 may pass through the first gate structural body 100G such that it may be in contact with the substrate 10. A second gate structural body 200G may include alternately and repeatedly stacked second insulation patterns 210 and 210U, and the second gate patterns 275 and 275U, on the first gate structural body 100G. The second active pattern 240 in the second gate structural body 200G may pass through the second gate structural body 200G and may be in contact with the first active pattern 140.

Figure 12:
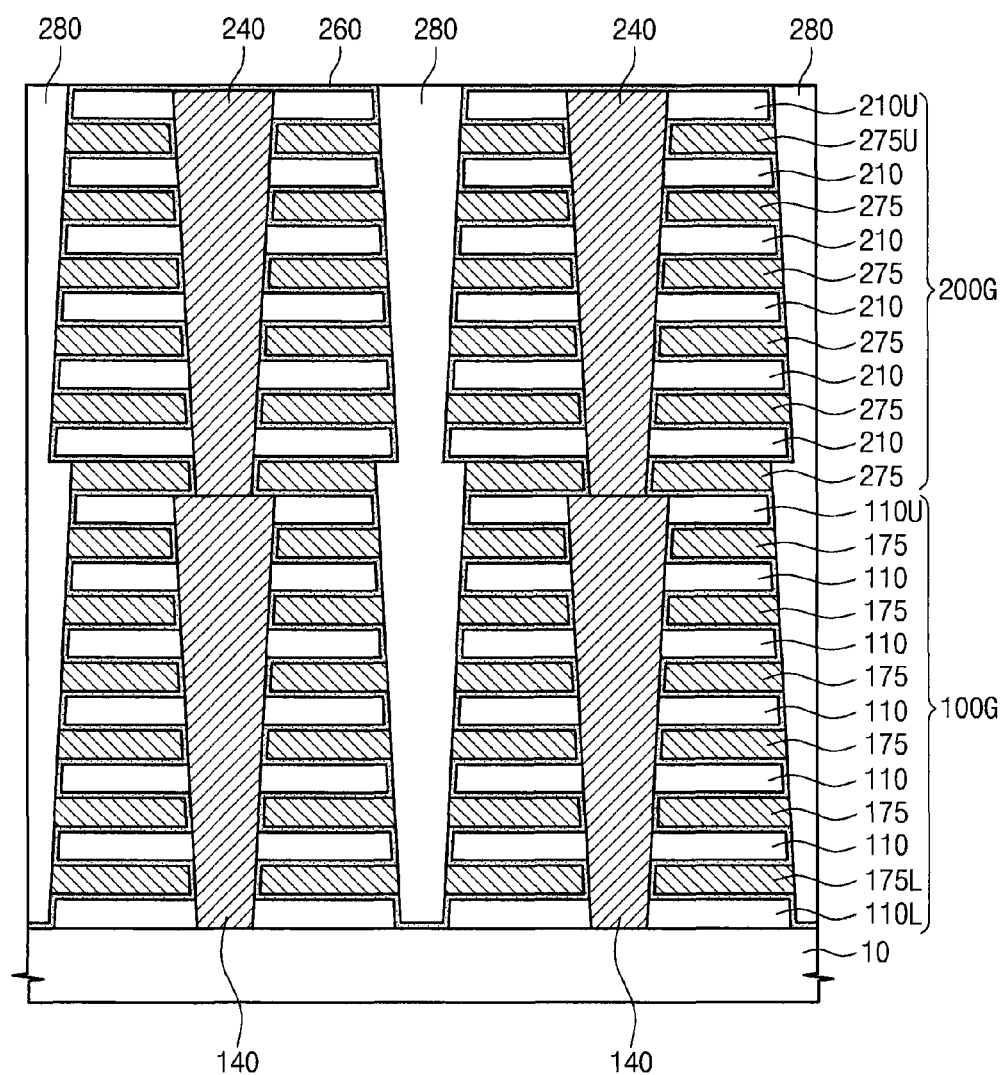

Referring to FIG. 12, a device isolation pattern 280 may be formed in the first and second trenches 105 and 205. The device isolation pattern 280 may include, for example, a silicon oxide, a silicon nitride and/or a silicon oxynitride. According to one or more example embodiments in which sidewalls of the first and second gate patterns 175, 175L, 275 and 275U are recessed laterally relative to the sidewalls of the first and second insulation patterns 110L, 110, 110U, 210 and 210U, the device isolation pattern 280 may fill the empty portions of the first and second empty regions 125, 125L, 225 and 225U.

According to example embodiments of the inventive concepts, when the sacrificial filling pattern 155 is removed, the sidewalls of the first and second insulation patterns 110L, 110, 110U, 210 and 210U, may be protected by the first and second spacers 150 and 250. The shapes of the first and second insulation patterns 110L, 110, 110U, 210 and 210U may be maintained. The shape of the first and second gate patterns 175, 175L, 275 and 275U, formed using the first and second empty regions 125, 125L, 225 and 225U as a mold, may be realized in reproducible manner. A three-dimensional semiconductor device having high and/or improved reliability and excellent and/or improved electrical characteristics may be realized.

Figure 13A:
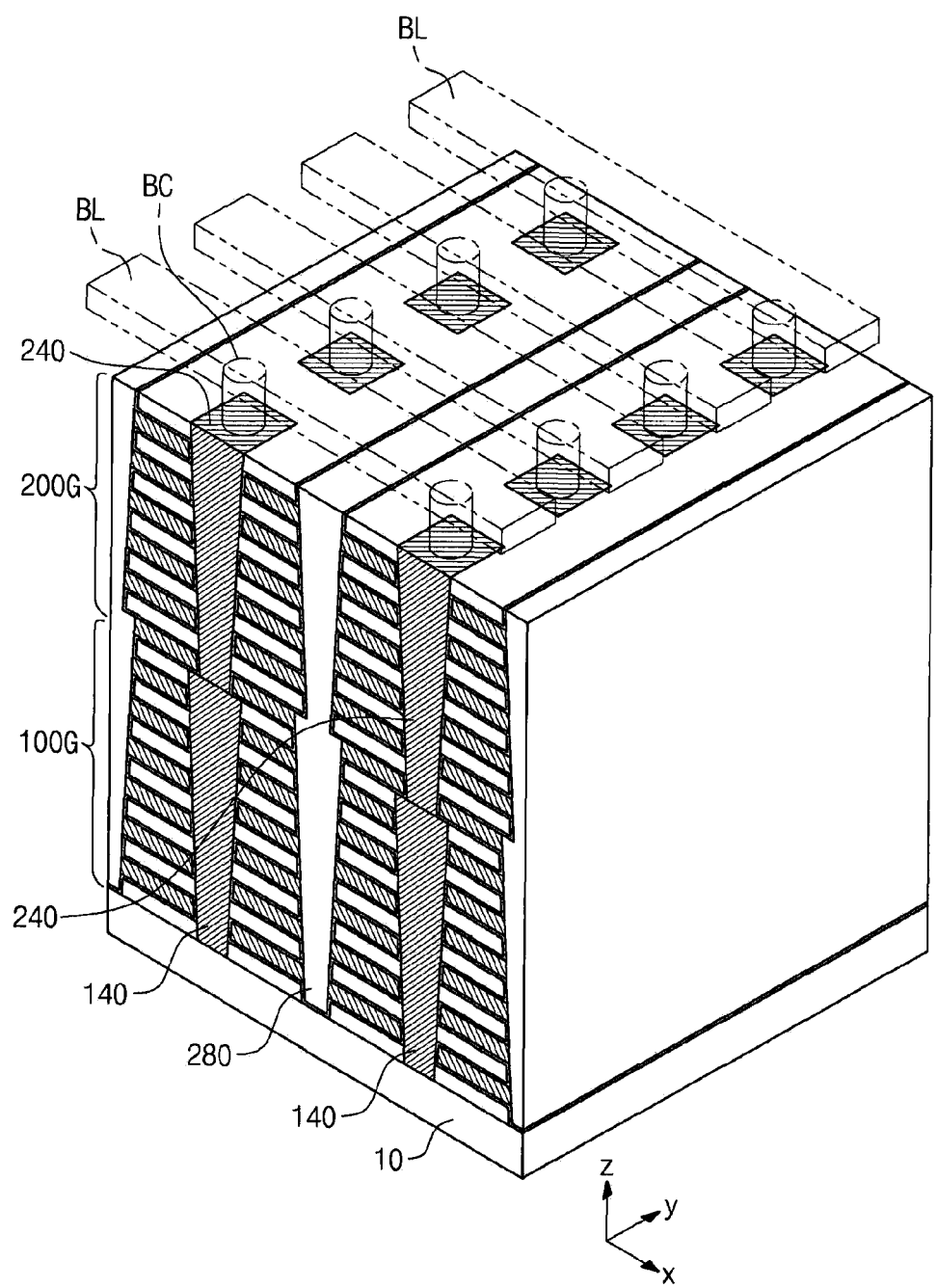
FIGS. 13A and 13B are perspective views illustrating three-dimensional semiconductor devices according to example embodiments of the inventive concepts.
Figure 13B:
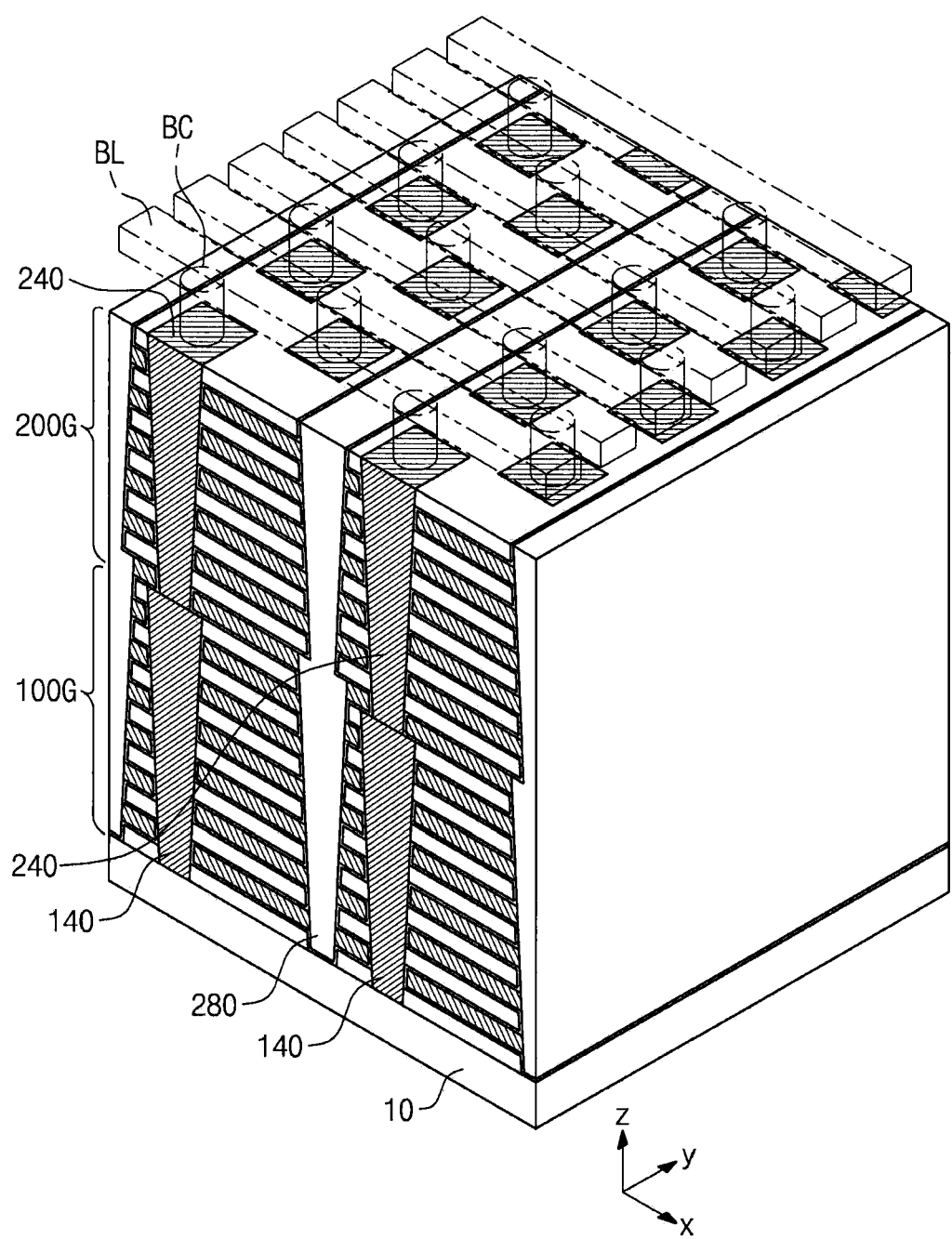

FIGS. 13A and 13B are perspective views illustrating three-dimensional semiconductor devices according to example embodiments of the inventive concepts. Referring to FIG. 13A, a drain region (not shown) may be formed in the upper portion of the second active pattern 240, and a bit line BL electrically connected to the drain region may be formed.

The stacked first and second gate structural bodies 100G and 200G may be referred to as a gate structural body group, and the stacked first and second active patterns 140 and 240 may be referred to as a string active pattern. As shown in FIG. 13A, a plurality of string active patterns may be in each gate structural body group. The string active patterns in each gate structural body group may be arranged along a first direction (e.g., the y direction) parallel to the substrate 10 in a line. Referring to FIG. 13B, a plurality of the string active patterns in each gate structural body group may be one pair of lines. The lines of a pair of lines may be spaced apart in a second direction (e.g., the x direction) perpendicular to the first direction. The string active patterns included in a first line among a pair of lines may not completely overlap in the second direction with the string active patterns included in a second line. For example, the string active patterns included in one pair of lines may be arranged in a zigzag pattern in the first direction.

Referring to FIGS. 13A and 13B, the first and second gate structural bodies 100G and 200G may extend in the first direction. Bit lines BL, which are electrically connected to the second active pattern 240, may be on the second gate structural body. The bit lines BL may extend in the second direction. Bit line contacts BC may be between the second active patterns 240 and the bit lines BL. The bit line contact BC may be in contact with the second active pattern 240 and the bit lines BL.

Figure 14:
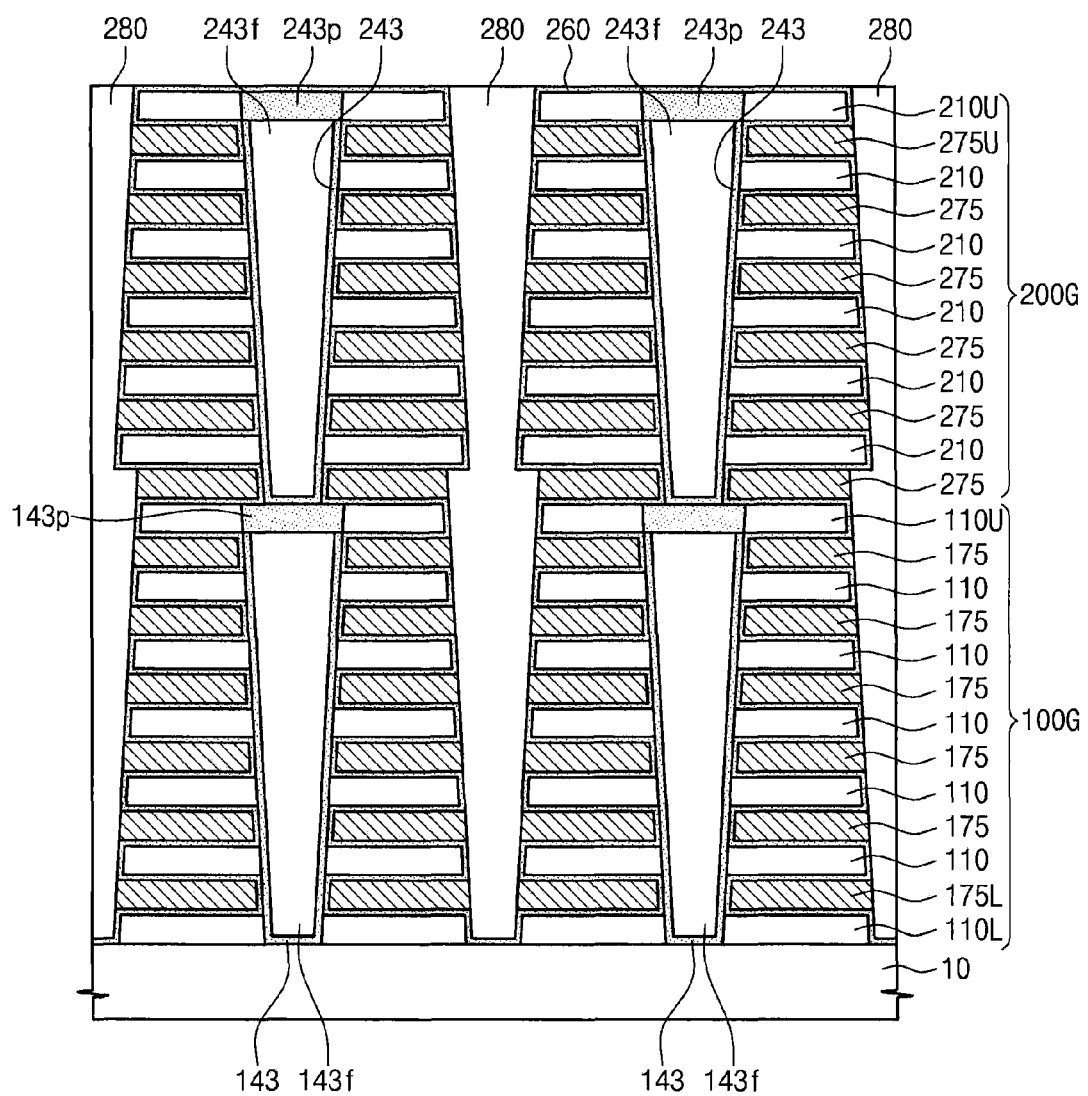

FIG. 14 is a cross-sectional diagram illustrating an example active pattern in a three-dimensional semiconductor device according to example embodiments of the inventive concepts. Referring to FIG. 14, a first active pattern 143, which may be conformal to outer surfaces of structures in a through-hole 130, may be in the first through-hole 130. A second active pattern 243, which may be conformal to outer surfaces surface of structures in a second through-hole 230, may be in the second through-hole 230. A cross-section of each of the first and second active patterns 143 and 243 may be U-shaped. The first and second active patterns 143 and 243 may include semiconducting materials. For example, the first and second active patterns 143 and 243 may include silicon, and the crystal structure of the silicon may be polycrystalline.

A first buried pattern 143$f$ and the first active pattern 143 may fill the first through-hole 130. The first buried pattern 143$f$ may be in the first through-hole 130 on the first active pattern 143. A second buried pattern 243$f$ and the second active pattern 243 may fill the second through-hole 230. The second buried pattern 243$f$ may be in the second through-hole 230 on the second active pattern 243. The first and second buried patterns 143$f$ and 243$f$ may include insulation materials. For example, the first and second buried patterns 143$f$ and 243$f$ may include a silicon oxide, a silicon nitride and/or a silicon oxynitride. Example embodiments of the inventive concepts are not limited thereto. The first and second buried patterns 143$f$ and 243$f$ may include insulation materials different from those described above.

A first pad 143$p$ may be between the first active pattern 143 and the first buried pattern 143$f$, and the second active pattern 243. A second pad 243$p$ may be on the upper surface of the second active pattern 243 and the second buried pattern 243$f$. The first and second pads 143$p$ and 243$p$ may include conductive materials.

Figure 15:
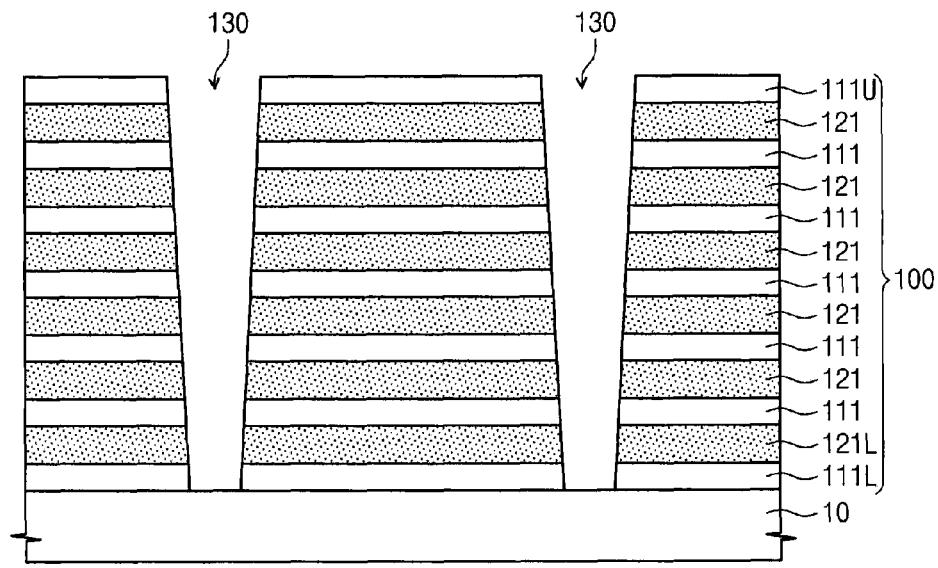

FIGS. 15-28 are cross-sectional diagrams illustrating methods of manufacturing three-dimensional semiconductor devices according to example embodiments of the inventive concepts. Referring to FIG. 15, a first stack structure 100 may be formed on a substrate 10. The substrate 10 may be formed of a semiconducting material. For example, the substrate 10 may be a silicon substrate, a silicon-germanium substrate and/or a germanium substrate. The substrate 10 may include a conductive pattern (not shown). The first stack structure 100 may be formed by alternately and repeatedly stacking first insulation layers 111L, 111 and 111U and first sacrificial layers 121 and 121L (e.g., alternating between insulation layers and sacrificial layers).

A first through-hole 130 may be formed to pass through the first stack structure 100. Forming the first through-hole 130 may include forming a mask pattern (not shown) defining the position of the first through-hole 130 on the first stack structure 100, and etching the first stack structure 100 using the mask pattern as an etch mask. Etching the first stack structure 100 may be performed by, for example, an anisotropic etch process. The first through-hole 130 may be formed in a downward tapered shape (e.g., as illustrated in the drawings). The sidewall in the first through-hole 130 may be defined by the sidewalls of the first insulation layers 111L, 111 and 111U and first sacrificial layers 121 and 121L, exposed by the first through-hole 130. The lower surface in the first through-hole 130 may be defined by a portion of the upper surface of the substrate 10 exposed by the first through-hole 130. A plurality of the first through-holes 130 may be formed in the first stack structure 100. The first through-holes 130 may be laterally spaced apart from each other. From a planar point of view, the first through-holes 130 may be arranged two-dimensionally in various forms.

Figure 16:
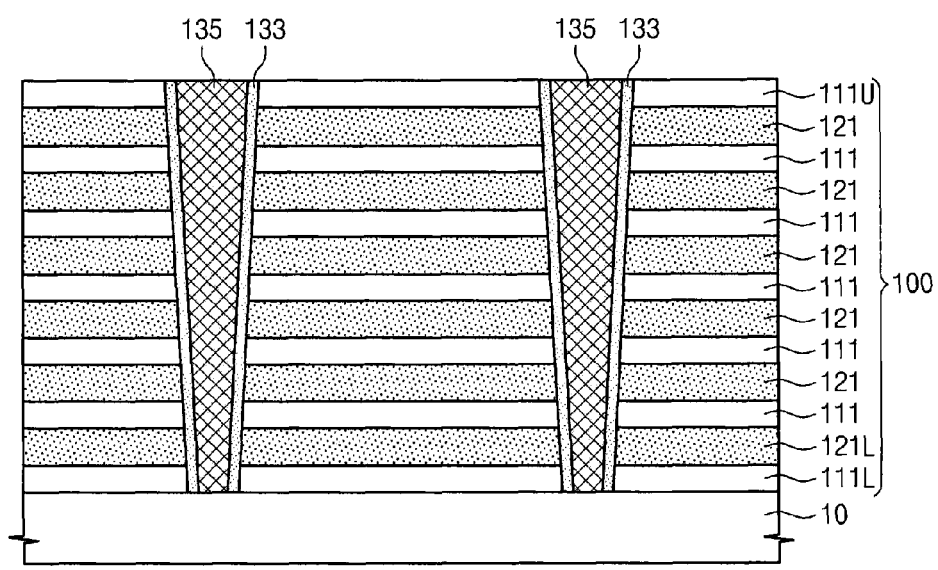

Referring to FIG. 16, a first hole spacer 133 may be formed on the sidewall of each first through-hole 130. A hole fill pattern 135 may be formed on each first hole spacer 133 to fill the inside of each first through-hole 130. The first hole spacer 133 may be formed of a material with etch selectivity to the hole fill pattern 135. The first hole spacer 133 may be formed of a material with etch selectivity to the first insulation layers 111L, 111 and 111U and the first sacrificial layers 121 and 121L. For example, according to one or more example embodiments in which the hole fill pattern 135 and the first insulation layers 111L, 111 and 111U include a silicon oxide, and the first sacrificial layers 121 and 121L include a silicon nitride, the first hole spacer 133 may be formed of, for example, silicon, silicon carbide and/or silicon oxynitride. Example embodiments of the inventive concepts are not limited thereto. The hole fill pattern 135, the first insulation layers 111L, 111 and 111U and the first sacrificial layers 121 and 121L may be formed of materials different from those described above. The first hole spacer 133 may be formed of a different material than the hole fill pattern 135, the first insulation layers 111L, 111 and 111U and the first sacrificial layers 121 and 121L.

Forming the hole fill pattern 135 may include forming a hole fill layer (not shown) on the first stack structure 100 and in inside of the first through-hole 130, and removing the hole fill layer on the first stack structure 100. Forming the hole fill layer may be performed by, for example, a chemical vapor deposition process. Forming the hole fill pattern 135 by removing the hole fill layer on the first stack structure 100 may be performed using, for example, an etch-back process and/or a chemical mechanical polishing process.

Figure 17:
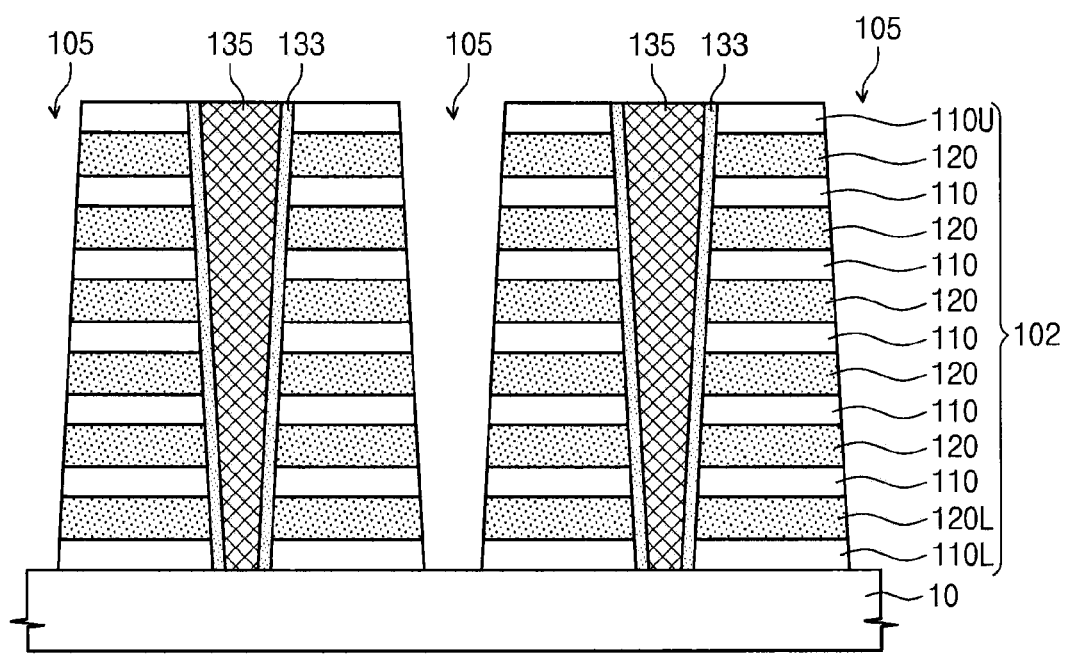

Referring to FIG. 17, a first trench 105 may be formed by patterning the first stack structure 100. The first trench 105 may define a first stack pattern 102 including a portion of the first stack structure 100. The first stack pattern 102 may include first insulation patterns 110L, 110 and 110U and first sacrificial patterns 120 and 120L stacked alternately and repeatedly. The first insulation patterns 110L, 110 and 110U may include a portion of the first insulation layers 111L, 111 and 111U, and the first sacrificial patterns 120 and 120L may include a portion of the first sacrificial layers 121 and 121L. According to one or more example embodiments, the first trench 105 may be formed to be the same shape, by using the same method, as described with reference to FIG. 2.

Figure 18:
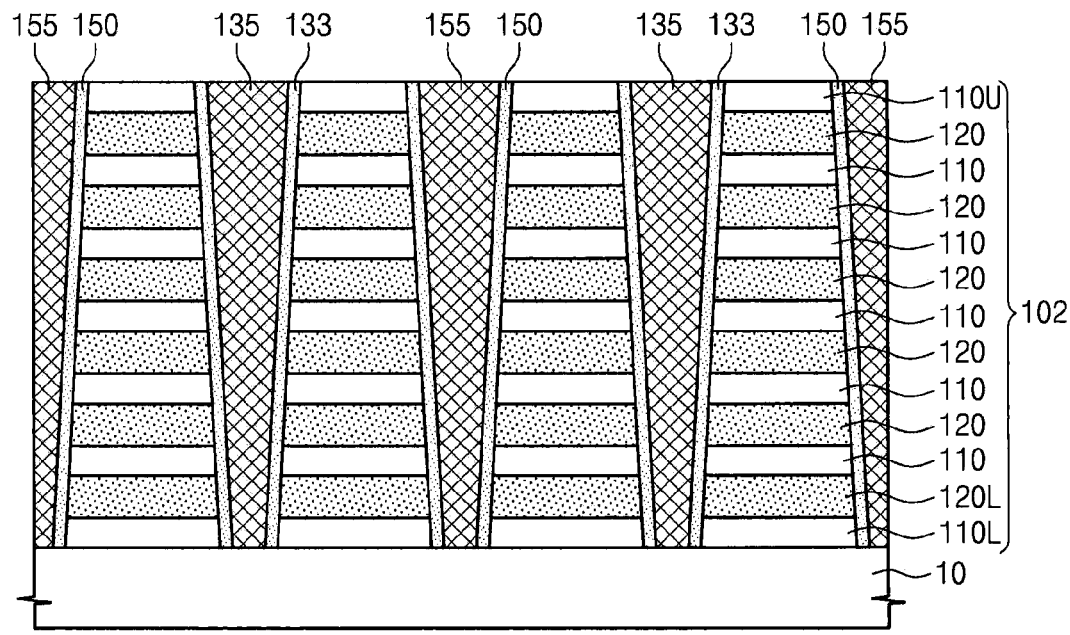

Referring to FIG. 18, a first spacer 150 may be formed on the sidewall of the first trench 105. A sacrificial filling pattern 155 may be formed to fill the first trench 105. The first spacer 150 may be formed as described with reference to FIG. 3. The first spacer 150 may be formed of a material with etch selectivity to the sacrificial filling pattern 155. The first spacer 150 may be formed of a material with etch selectivity to the first insulation patterns 110L, 110 and 110U.

For example, according to one or more example embodiments in which the sacrificial filling pattern 155 and the first insulation patterns 110L, 110 and 110U include a silicon oxide, the first spacer 150 may include a silicon nitride, a silicon oxynitride, silicon and/or a silicon carbide. Example embodiments of the inventive concepts are not limited thereto. The sacrificial filling pattern 155 and the first insulation patterns 110L, 110 and 110U may be formed of a material different from those described above, and the first spacer 150 may be formed of a material different from the sacrificial filling pattern 155 and the first insulation patterns 110L, 110 and 110U. The first spacer 150 may be formed of the same material as the first sacrificial patterns 120 and 120L. According to one or more example embodiments the sacrificial filling pattern 155 may be formed by the same method as described with reference to FIG. 3.

According to example embodiments of the inventive concepts, the first trench 105 and the first through-hole 130 may be formed at the same time (not shown). The first trench 105 and the first through-hole 130 may be formed by forming a mask pattern (not shown) defining the position of the first trench 105 and the first through-hole 130, and by etching the first stack structure 100 using the mask pattern as an etch mask. The first trench 105 and the first through-hole 130 may be formed by, for example, an anisotropic etch process. A first hole spacer 133 and a first spacer 150 may be formed together by the same processes, and the hole fill pattern 135 and the sacrificial filling pattern 155 may also be formed at the same time by the same processes. The first hole spacer 133 and the first spacer 150 may be formed of a material with etch selectivity to the hole fill pattern 135, the sacrificial filling pattern 155, the first insulation patterns 110L, 110 and 110U, and the first sacrificial patterns 120 and 120L, respectively.

For example, according to one or more example embodiments in which the hole fill pattern 135, the sacrificial filling pattern 155 and the first insulation patterns 110L, 110 and 110U include a silicon oxide, and the first sacrificial patterns 120 and 120L include a silicon nitride, the first hole spacer 133 and the first spacer 150 may include, for example, silicon, a silicon carbide and/or a silicon oxynitride. Example embodiments of the inventive concepts are not limited thereto. The hole fill pattern 135, the sacrificial filling pattern 155, the first insulation patterns 110L, 110 and 110U, and the first sacrificial patterns 120 and 120L, may be formed of a material different those described above, and the first hole spacer 133 and the first spacer 150 may be formed of a material different from the hole fill pattern 135, the sacrificial filling pattern 155, the first insulation patterns 110L, 110 and 110U and the first sacrificial patterns 120 and 120L.

Forming the hole fill pattern 135 and the sacrificial filling pattern 155 may include forming a fill layer to fill the first through-hole 130 and the first trench 105, and forming the fill layer on the entire surface of the substrate 10. The hole fill pattern 135 and the sacrificial filling pattern 155 may be formed by, for example, removing the fill layer on the first stack pattern 102.

Figure 19:
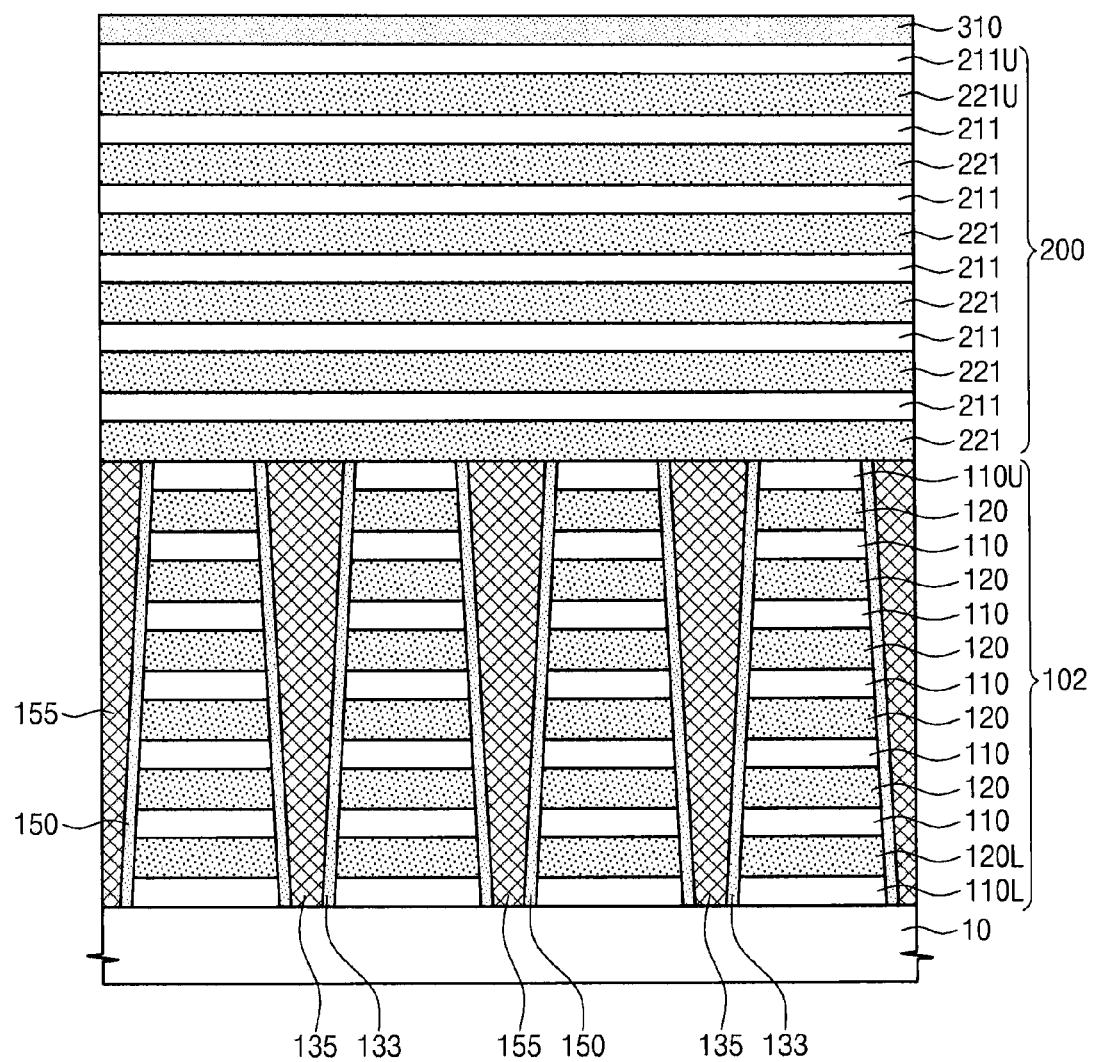

Referring to FIG. 19, a second stack structure 200 may be formed on the sacrificial filling pattern 155 and the first stack pattern 102. The second stack structure 200 may be formed by alternately and repeatedly stacking second insulation layers 211 and 211U and second sacrificial layers 221 and 221U. The second sacrificial layers 221 and 221U may be formed of a material with an etch selectivity to the second insulation layers 211 and 211U. For example, according to one or more example embodiments in which the second insulation layers 211 and 211U are formed of a silicon oxide, the second sacrificial layers 221 and 221U may be formed of silicon, a silicon nitride, a silicon carbide and/or a silicon oxynitride. According to one or more example embodiments in which the second insulation layers 211 and 211U are formed of silicon nitride, the second sacrificial layers 221 and 221U may include, for example, silicon, a silicon oxide, a silicon carbide and/or a silicon oxynitride.

Example embodiments of the inventive concepts are not limited thereto. The second insulation layers 211 and 211U may be formed of different insulation materials, and the respective second sacrificial layers 221 and 221U may be formed of a material different from the second insulation layers 211 and 211U. The second insulation layers 211 and 211U may be formed of the same material as the first insulation layers 111L, 111 and 111U, and the second sacrificial layers 221 and 221U may be formed of the same material as the first sacrificial layers 121 and 121L.

A first etch stop layer 310 may be formed on the second stack structure 200. The first etch stop layer 310 may be formed of a material with etch selectivity to the hole fill pattern 135. For example, according to one or more example embodiments in which the hole fill pattern 135 is includes a silicon oxide, the first etch stop layer 310 may include, for example, a silicon carbide, a silicon nitride and/or a silicon oxynitride. Example embodiments of the inventive concepts are not limited thereto. The hole fill pattern 135 may be formed of a material different from those described above and the first etch stop layer 310 may be formed of a material different from the hole fill pattern 135. The first etch stop layer 310 may be the same material as the first hole spacer 133. According to one or more example embodiments the first etch stop layer 310 may be omitted.

Figure 20:
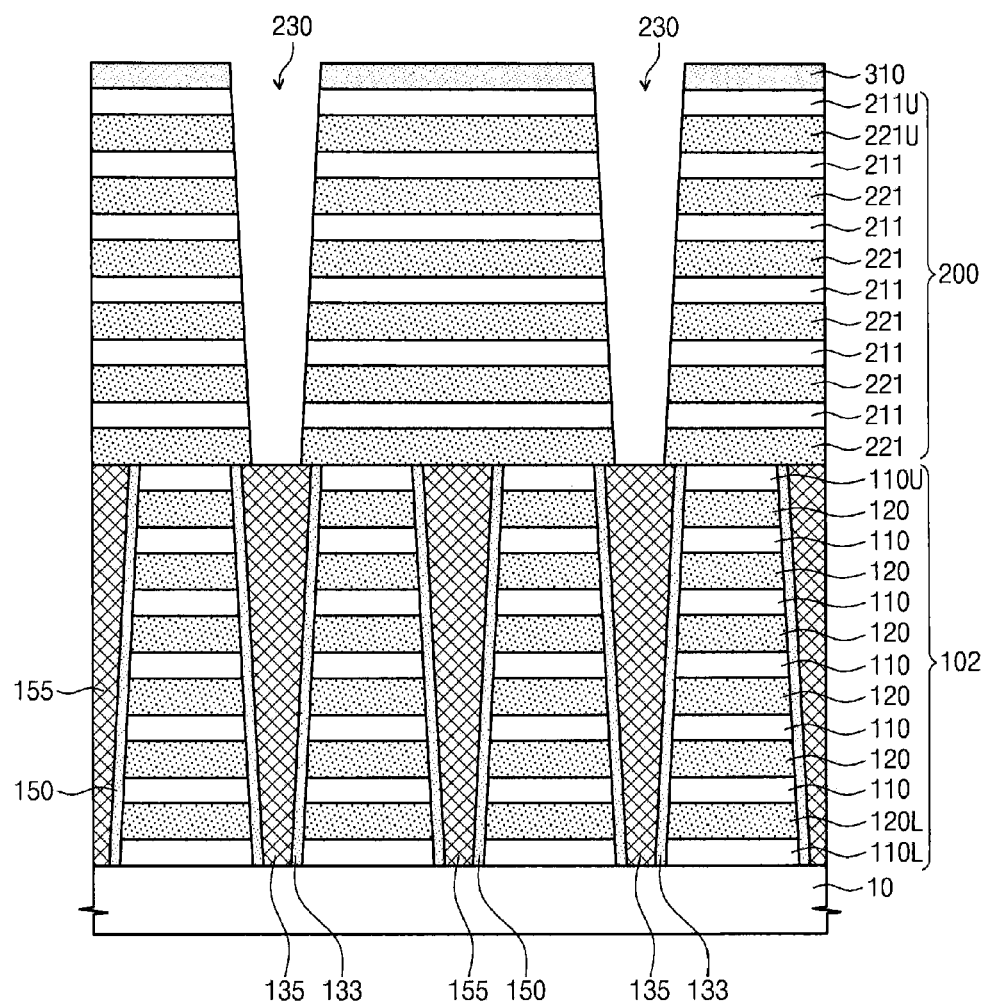

Referring to FIG. 20, a second through-hole 230 passing through the second stack structure 200 and the first etch stop layer 310 to expose the upper surface of the each hole fill pattern 135, may be formed. The sidewall in the second through-hole 230 may be defined by the side surfaces of the second insulation layers 211 and 211U and the second sacrificial layers 221 and 221U exposed by the second through-hole 230. The second through-hole 230 may be two-dimensionally arranged in various forms from a planar point of view. Forming the second through-hole 230 may include forming a mask pattern (not shown) defining the position of the second through-hole 230 on the second stack structure and etching the second stack structure 200 using the mask pattern as an etch mask. The second stack structure 200 may be etched by, for example, an anisotropic etch process. The second through-hole 230 may be formed in a downward tapered shape (e.g., as illustrated in the drawings).

Figure 21:
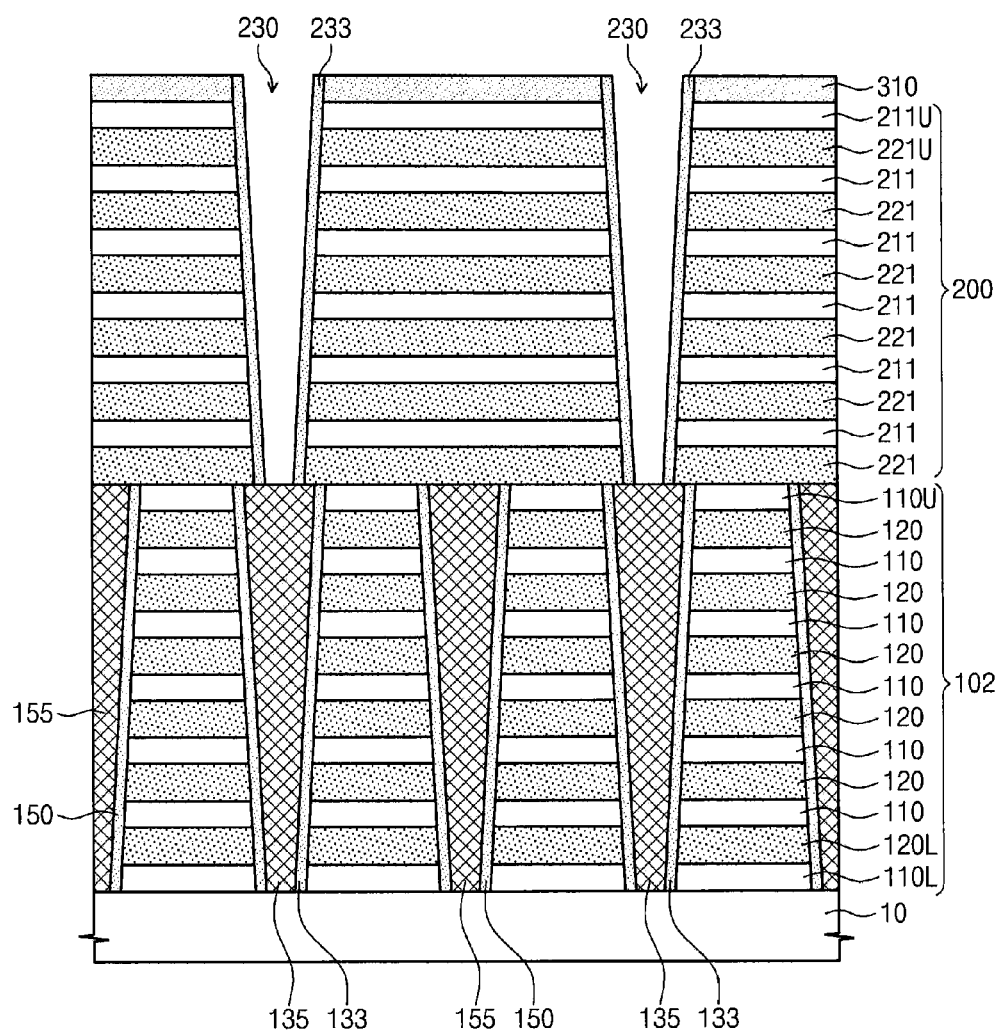

Referring to FIG. 21, a second hole spacer 233 may be formed on the sidewall inside the second through-hole 230. The second hole spacer 233 may be formed of a material with etch selectivity to the hole fill pattern 135. The second hole spacer 233 may be formed of a material with etch selectivity to the first insulation patterns 110L, 110, and 110U, the second insulation layers 211 and 211U, the first sacrificial patterns 120 and 120L, and the second sacrificial layers 221 and 221U. For example, according to one or more example embodiments in which the hole fill pattern 135, the first insulation patterns 110L, 110, 110U, and second insulation layers 211 and 211U include a silicon oxide, and the first sacrificial patterns 120 and 120L, and the second sacrificial layers 221 and 221U include a silicon nitride, the second hole spacer 233 may include, for example, silicon, a silicon carbide and/or a silicon oxynitride. Example embodiments of the inventive concepts are not limited thereto. The hole fill pattern 135, the first insulation patterns 110L, 110, 110U, the second insulation layers 211 and 211U, the first sacrificial patterns 120 and 120L, and the second sacrificial layers 221 and 221U, may be formed of a material different from those described above. The second hole spacer 233 may be formed of a material different from a material of the hole fill pattern 135, the first insulation patterns 110L, 110, 110U, the second insulation layers 211 and 211U, the first sacrificial patterns 120 and 120L, and the second sacrificial layers 221 and 221U. The second hole spacer 233 may be formed of the same material as the first hole spacer 133.

Figure 22:
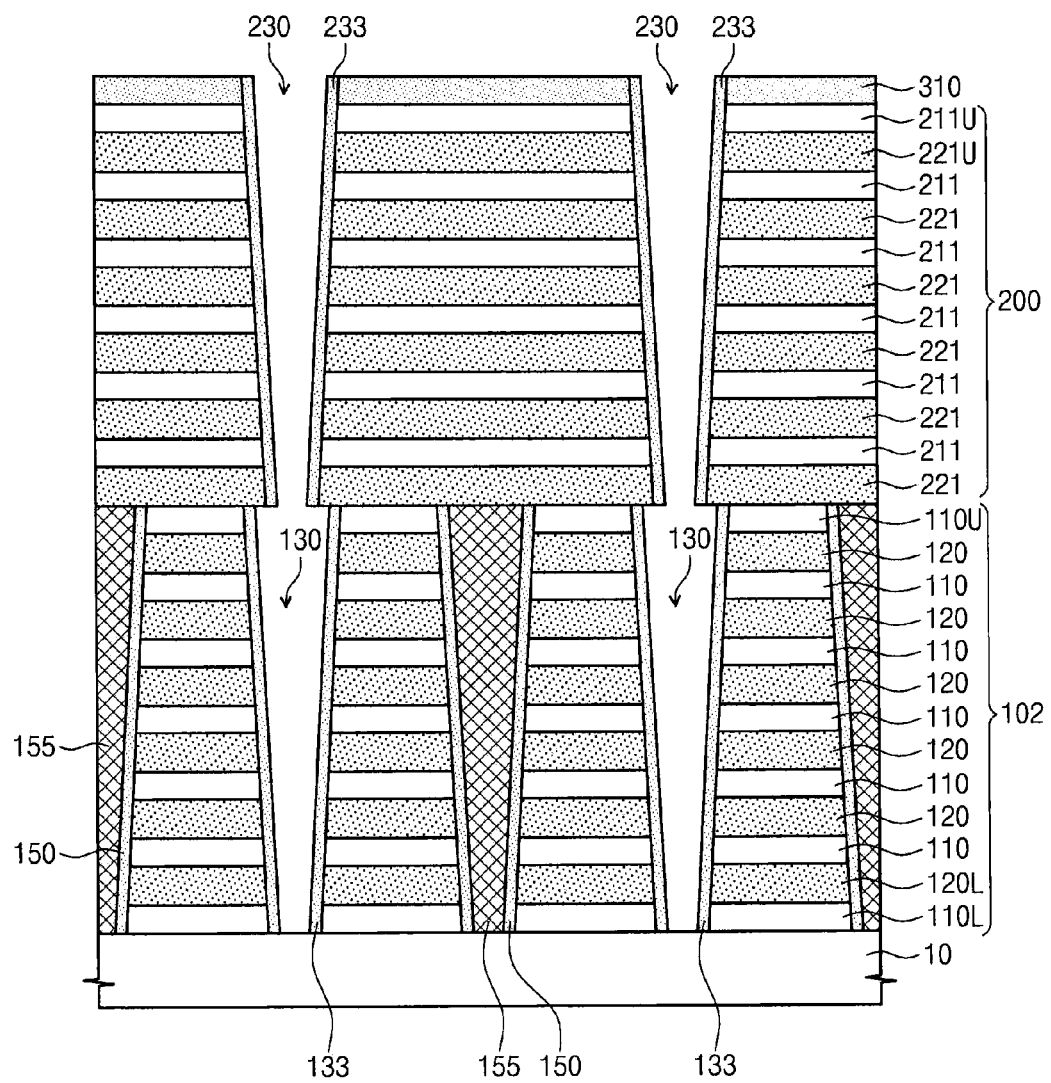

Referring to FIG. 22, the hole fill pattern 135 exposed by the second through-hole 230 may be removed. The first and second hole spacers 133 and 233 may have etch selectivity with respect to the hole fill pattern 135 such that the first and second hole spacers 133 and 233 are not removed during the removal of the hole fill pattern 135. The first and second hole spacers 133 and 233 may protect the sidewalls in the first and second through-holes 130 and 230 (e.g., the sidewalls of the first stack pattern 102 and the second stack structure 200) during the removal of the hole fill pattern 135. The shape of the first stack pattern 102 and the second stack structure 200 may be maintained during the removal of the hole fill pattern 135. The hole fill pattern 135 may be removed by, for example, an isotropic etch process (e.g., wet etch and/or dry isotropic etch). The first etch stop layer 310 may prevent and/or reduce a second insulation layer 211U of the uppermost second stack structure 200 from damage by the removal process of the hole fill pattern 135.

Figure 23:
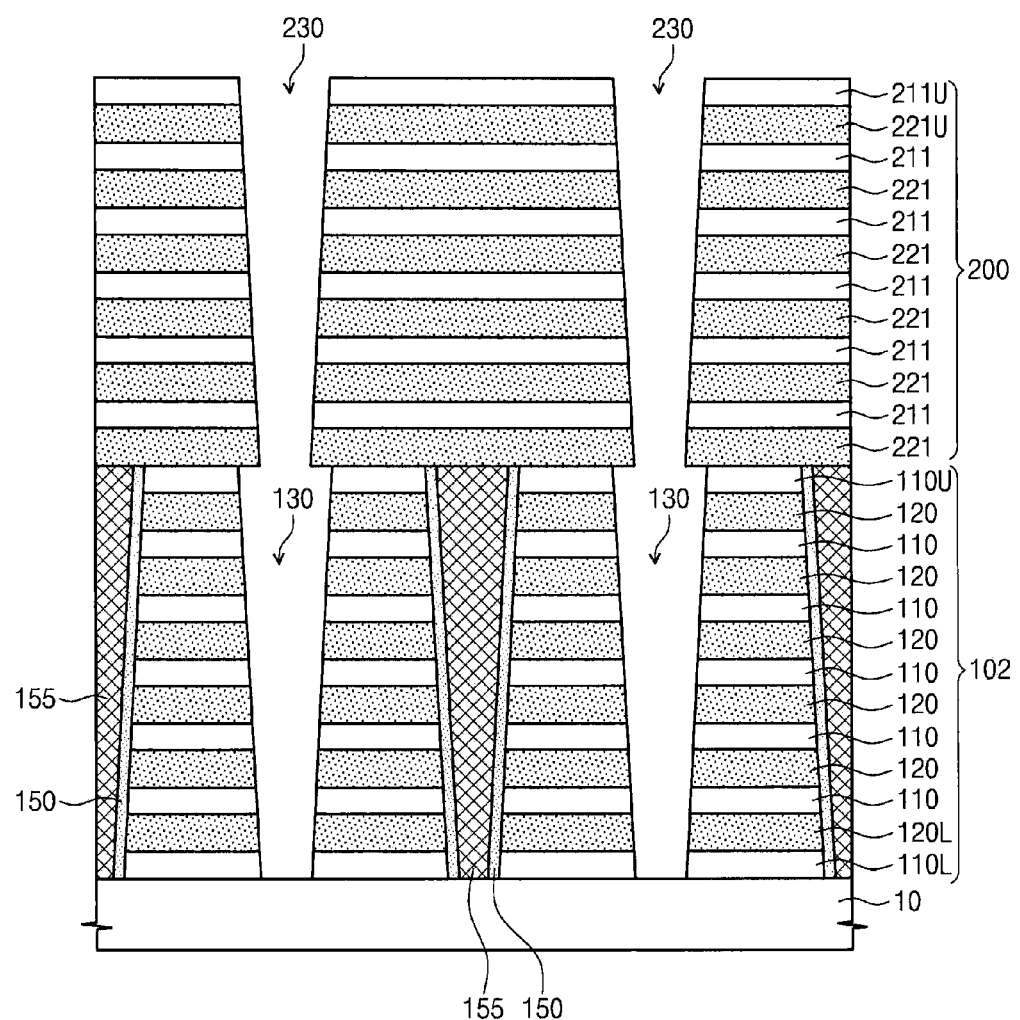

Referring to FIG. 23, the first and second hole spacers 133 and 233, and the first etch stop layer 310, may be removed by an isotropic etch process, for example. When the first and second hole spacers 133 and 233, and the first etch stop layer 310, are removed, the first insulation patterns 110L, 110, 110U, the second insulation layers 211 and 211U, the first sacrificial patterns 120, 120L, and the second sacrificial layers 221 and 221U may remain. The first and second hole spacers 133 and 233 and the first etch stop layer 310 may be sequentially removed regardless of the order by different etch processes, respectively. According to one or more example embodiments, the first and second hole spacers 133 and 233, and the first etch stop layer 310, may be removed by the same etch process.

Figure 24:
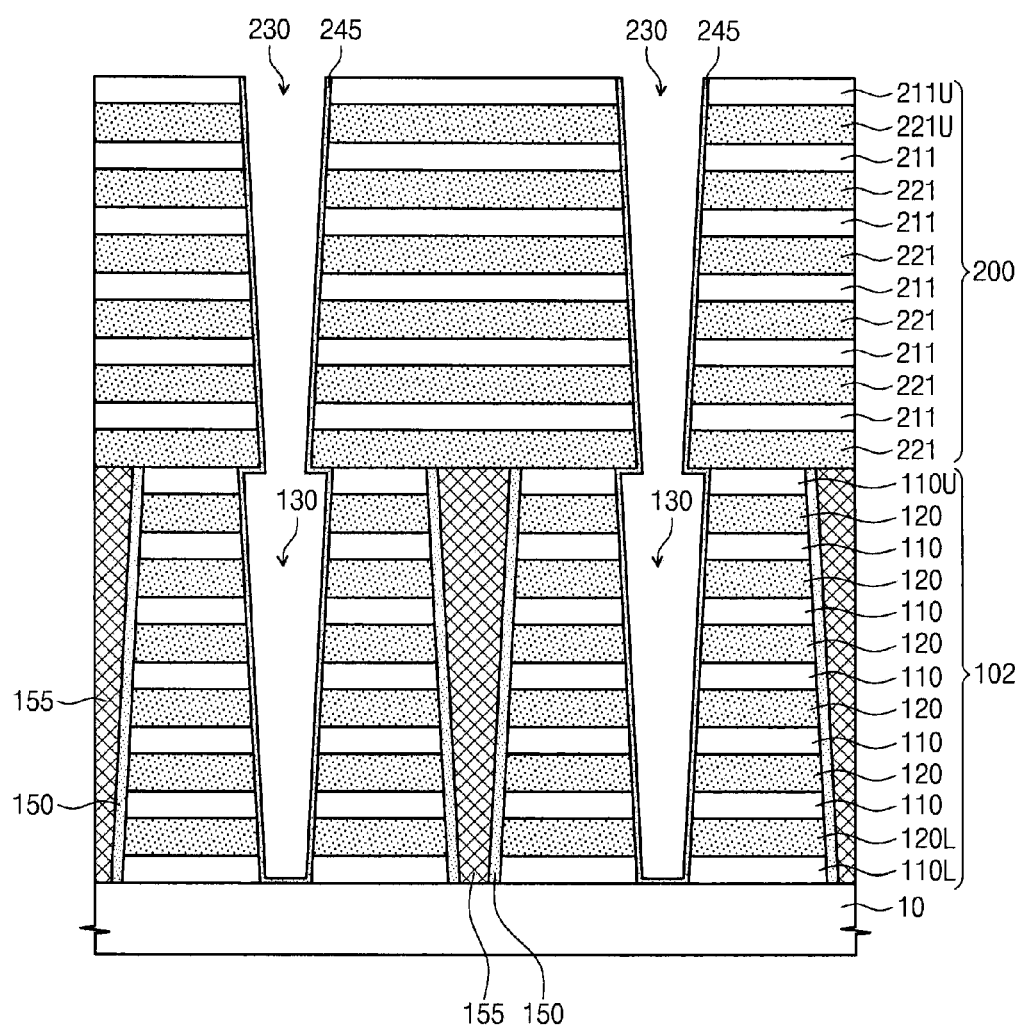

Referring to FIG. 24, an active pattern 245 conformally covering a surface in the first and second through-holes 130 and 230 may be formed in the first and second through-holes 130 and 230. The active pattern 245 may be formed to be in contact with the sidewalls in the first and second through-holes 130 and 230, and the substrate 10 exposed by the first through-hole 130. The active pattern 245 may be formed with a U-shaped cross-section. The active pattern 245 may be formed of a semiconducting material. For example, the active pattern 245 may be formed of silicon, and the crystal structure may be polycrystalline. Example embodiments of the inventive concepts are not limited thereto. The active pattern 245 may be formed of a material different from those described above, and may have a different crystal structure. Forming the active pattern 245 may be performed using, for example, a chemical vapor deposition process and/or an atomic layer deposition process.

Figure 25:
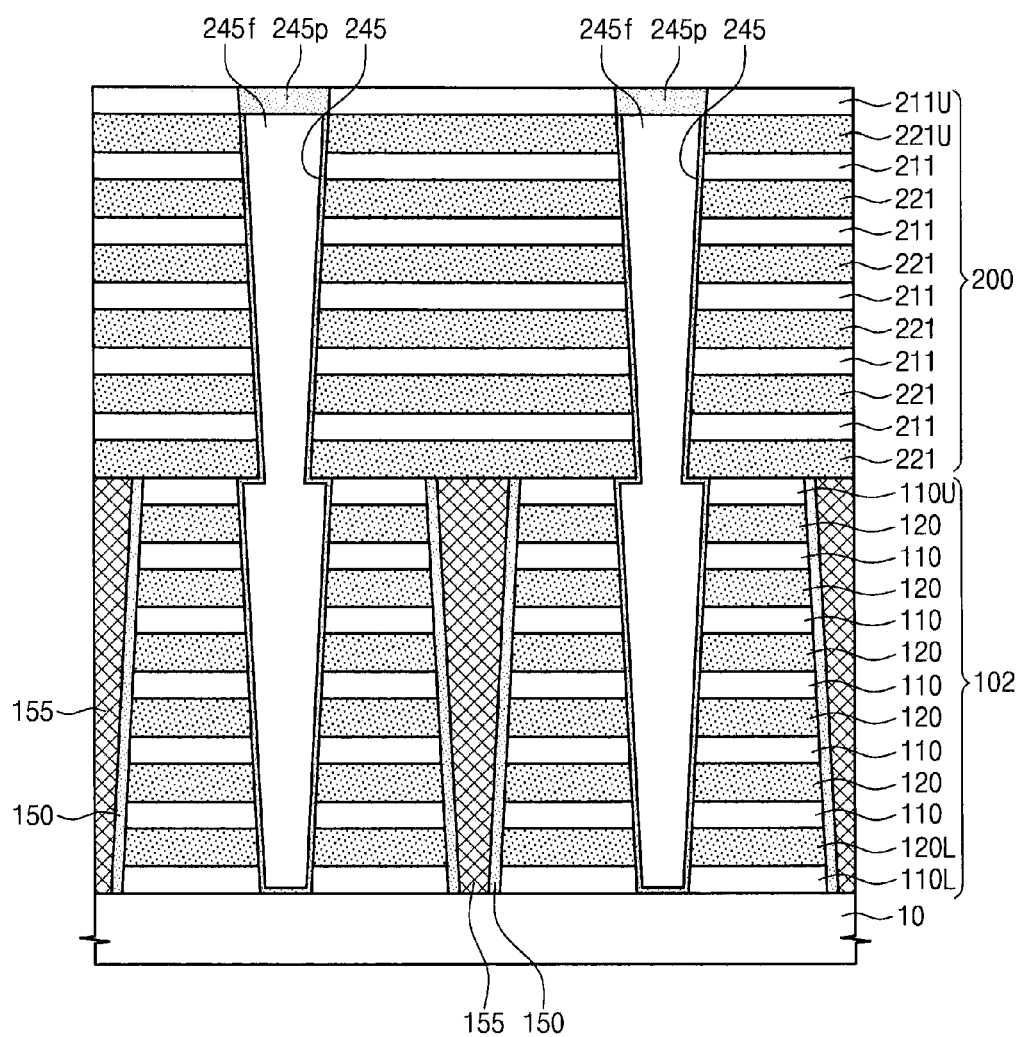

Referring to FIG. 25, a buried pattern 245f may be formed to fill the first and second through-holes 130 and 230 on the active pattern 245. The buried pattern 245f may be formed of, for example, an insulation material. For example, the buried pattern 245f may include a silicon oxide, a silicon nitride, and/or a silicon oxynitride. Forming the buried pattern 245f may include forming a buried layer (not shown) to fill the inside of the first and second through-holes 130 and 230, and on the entire surface of the second stack structure 200, and removing the buried layer on the upper surface of the second stack structure 200. The buried layer on the upper surface of the second stack structure 200 may be removed by, for example, an etch-back process and/or a chemical mechanical polishing process. When removing the buried layer on the second stack structure 200, the upper portion of the buried pattern 245f may be recessed relative to the upper surface of the second stack structure 200. The upper surface of the buried pattern 245f may be formed lower than the upper surface of the second stack structure 200 relative to the substrate. A pad 245p may be formed in contact with the active pattern 245, and on the buried pattern 245f. The pad 245p may be formed of, for example, a conductive material.

Figure 26:
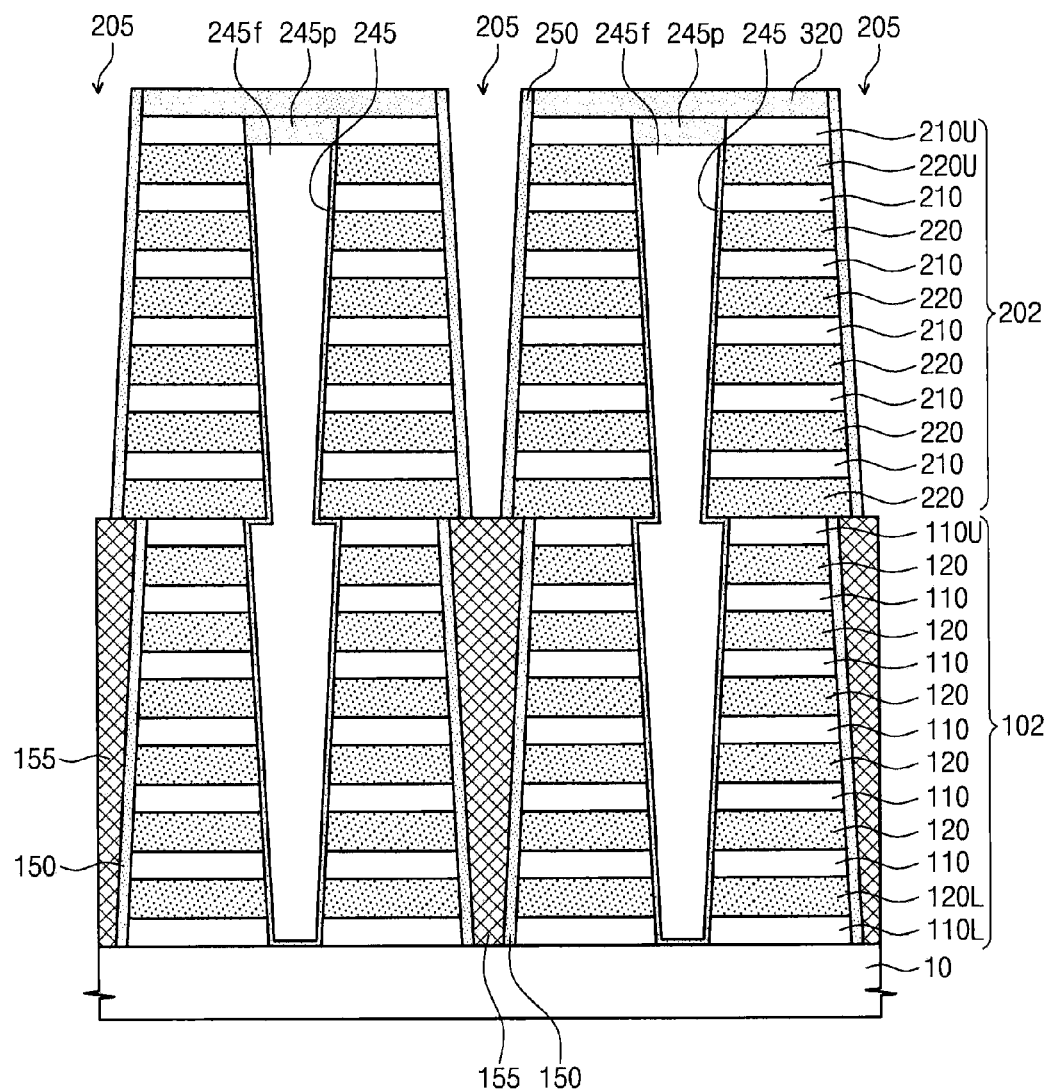

Referring to FIG. 26, a second etch stop layer 320 may be formed on the second stack structure 200. The second etch stop layer 320 may be a material with etch selectivity to the sacrificial filling pattern 155. For example, according to one or more example embodiments in which the sacrificial filling pattern 155 includes a silicon oxide, the second etch stop layer 320 may include silicon, a silicon oxynitride, a silicon carbide and/or a silicon nitride. Example embodiments of the inventive concepts are not limited thereto. The sacrificial filling pattern 155 may be formed of a material different from those described above, and the second etch stop layer 320 may be formed of a material different from the sacrificial filling pattern 155. The second etch stop layer 320 may be the same material as the first spacer 150 and/or the second spacer 250. According to one or more example embodiments the second etch stop layer 320 may be omitted.

A second trench 205 may be formed by patterning the second stack structure 200 and the second etch stop layer 320 (e.g., continuously patterning). The second trench 205 may define a second stack pattern 202 including a portion of the second stack structure 200 by patterning the second stack structure 200. The second stack pattern 202 may include second insulation patterns 210 and 210U, and second sacrificial patterns 220 and 220U, stacked alternately and repeatedly. The second insulation patterns 210 and 210U may be formed to include a portion of the second insulation layers 211 and 211U, and the second sacrificial patterns 220 and 220U may be formed to include a portion of the second sacrificial layers 221 and 221U. According to one or more example embodiments, the second trench 205 may be formed with the same shape and by the same method as described with reference to FIG. 6.

A second spacer 250 may be formed on the sidewall of the second trench 205. According to one or more example embodiments the second spacer 250 may be formed to be the same shape, using the same method, as described with reference to FIG. 7. The second spacer 250 may be formed of a material with etch selectivity to the first insulation patterns 110L, 110 and 110U, and the second insulation patterns 210 and 210U. The second spacer 250 may be formed of the same material as the first spacer 150. The second spacer 250 may be formed of the same material as the first and second sacrificial patterns 120, 120L, 220 and 220U. For example, according to one or more example embodiments in which the sacrificial filling pattern 155 and the first and second insulation patterns 110L, 110, 110U, 210 and 210U include a silicon oxide, the second spacer 250 may include silicon oxynitride, silicon carbide, silicon and/or silicon nitride. Example embodiments of the inventive concepts are not limited thereto. The sacrificial filling pattern 155 and the first and second insulation patterns 110L, 110, 110U, 210 and 210U may be formed of a material different from those described above, and the second spacer 250 may be formed of a material different from the sacrificial filling pattern 155 and the first and second insulation patterns 110L, 110, 110U, 210 and 210U.

According to one or more example embodiments, the second spacer 250 may be formed of a material with etch selectivity to the first and second sacrificial patterns 120, 120L, 220 and 220U. For example, according to one or more example embodiments in which the first and second sacrificial patterns 120, 120L, 220 and 220U include silicon nitrides and the sacrificial filling pattern 155 and the first and second insulation patterns 110L, 110, 110U, 210 and 210U include a silicon oxide, the second spacer 250 may include, for example, a silicon oxynitride, a silicon carbide and/or silicon. Example embodiments of the inventive concepts are not limited thereto. The sacrificial filling pattern 155 and the first and second insulation patterns 110L, 110, 110U, 210 and 210U may be formed of a material different from those described above, and the second spacer 250 may be formed of a material different from the first and second sacrificial patterns 120, 120L, 220 and 220U, the sacrificial filling pattern 155 and the first and second insulation patterns 110L, 110, 110U, 210 and 210U. The second spacer 250 may be formed of the same material as the first and second hole spacers 133 and 233.

Figure 27:
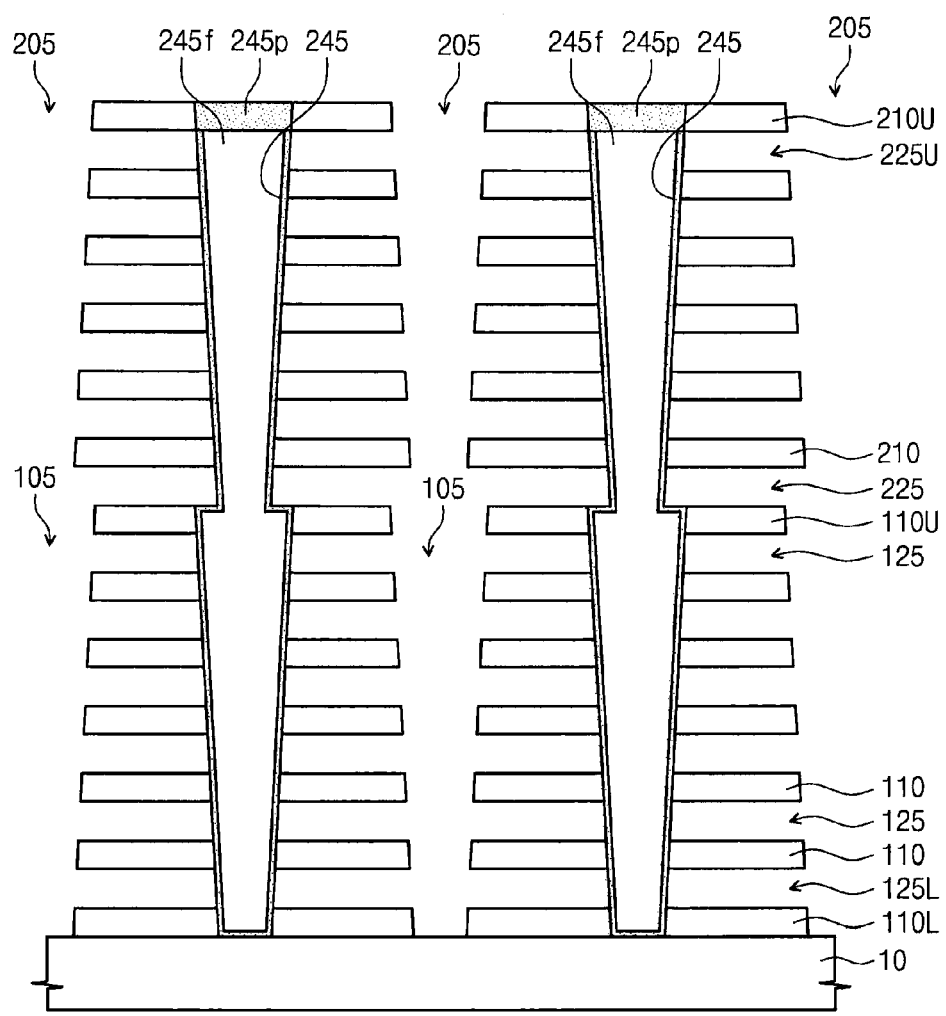

Referring to FIG. 27, the sacrificial filling pattern 155 exposed by the second trench 205 may be removed. The first and second spacers 150 and 250 have etch selectivity with respect to the sacrificial filling pattern 155 such that the first and second spacers 150 and 250 may remain during the removal of the sacrificial filling pattern 155. During the removal process of the sacrificial filling pattern 155, the first and second spacers 150 and 250 may protect the sidewalls in the first and second trenches 105 and 205 (e.g., the sidewalls of the first and second stack patterns 102 and 202). The shape of the first and second stack patterns 102 and 202 may be maintained. The second etch stop layer 320 may prevent and/or reduce damage to the second insulation pattern 210U of the uppermost second stack pattern 202 by the removal process of the sacrificial filling pattern 155. The sacrificial filling pattern 155 may be removed by, for example, an isotropic etch process (e.g., a wet etch and/or a dry isotropic etch).

The first and second spacers 150 and 250, and the first and second sacrificial patterns 120, 120L, 220 and 220U, may be removed from the first and second trenches 105 and 205. First and second empty regions 125, 125L, 225, 225U may be formed. The first empty regions 125 and 125L may horizontally extend from the first trench 105 such that the sidewall of the active pattern 245 may be exposed. The second empty regions 225 and 225U may horizontally extend from the second trench 205 such that the sidewall of the active pattern 245 may be exposed. The second etch stop layer 320 may be removed by, for example, the etch process in which the first and second spacers 150 and 250 are removed.

Removing the first and second spacers 150 and 250 and the first and second sacrificial patterns 120, 120L, 220 and 220U may be sequentially performed by different processes, respectively. According to one or more example embodiments, the first and second spacers 150 and 250, and the first and second sacrificial patterns 120, 120L, 220 and 220U, may be removed by one etch process. Removing the first and second spacers 150 and 250 and the first and second sacrificial patterns 120, 120L, 220 and 220U may be performed, according to one or more example embodiments, by the same method as described with reference to FIG. 9. Because etch selectivity with respect to the first and second insulation patterns 110L, 110, 110U, 210 and 210U, is used, the first and second insulation patterns 110L, 110, 110U, 210 and 210U may remain when the first and second spacers 150 and 250 and the first and second sacrificial patterns 120, 120L, 220 and 220U are removed.

Figure 28:
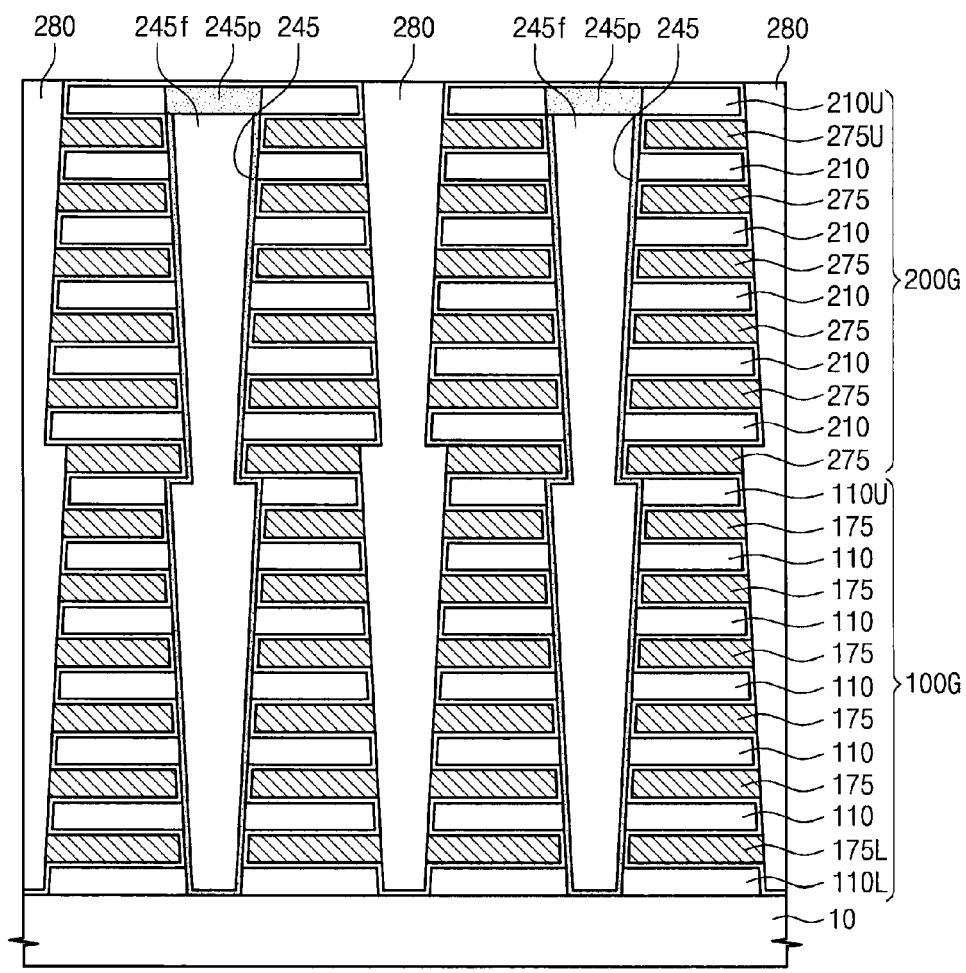

Referring to FIG. 28, according to one or more example embodiments, a data storage layer 260 and first and second gate patterns 175, 175L, 275 and 275U may be formed on the surface inside the first and second empty regions 125, 125L, 225 and 225U, using the same method as described with reference to FIGS. 10 and 11. According to one or more example embodiments, the data storage layer 260 may be formed with the same shape as described with reference to FIG. 10.

The first gate patterns 175 and 175L may be formed in the first empty regions 125 and 125L, respectively, and the second gate patterns 275 and 275U may be formed in the second empty regions 225 and 225U, respectively. The sidewalls of the first and second gate patterns 175, 175L, 275 and 275U may be laterally recessed relative to the first and second insulation patterns 110L, 110, 110U, 210 and 210U. The first and second gate patterns 175, 175L, 275 and 275U may include, for example, doped silicon, tungsten, conductive metal nitrides and/or metal silicides.

According to one or more example embodiments the device isolation pattern 280 may be formed in the first and second trenches 105 and 205 with the same method as described with reference to FIGS. 11 and 12. According to one or more example embodiments in which the sidewalls of the first and second gate patterns 175, 175L, 275 and 275U are laterally recessed relative to the sidewalls of the first and second insulation patterns 110L, 110, 110U, 210 and 210U, the device isolation pattern 280 may fill the empty portions of the first and second empty regions 125, 125L, 225 and 225U.

Figure 29:
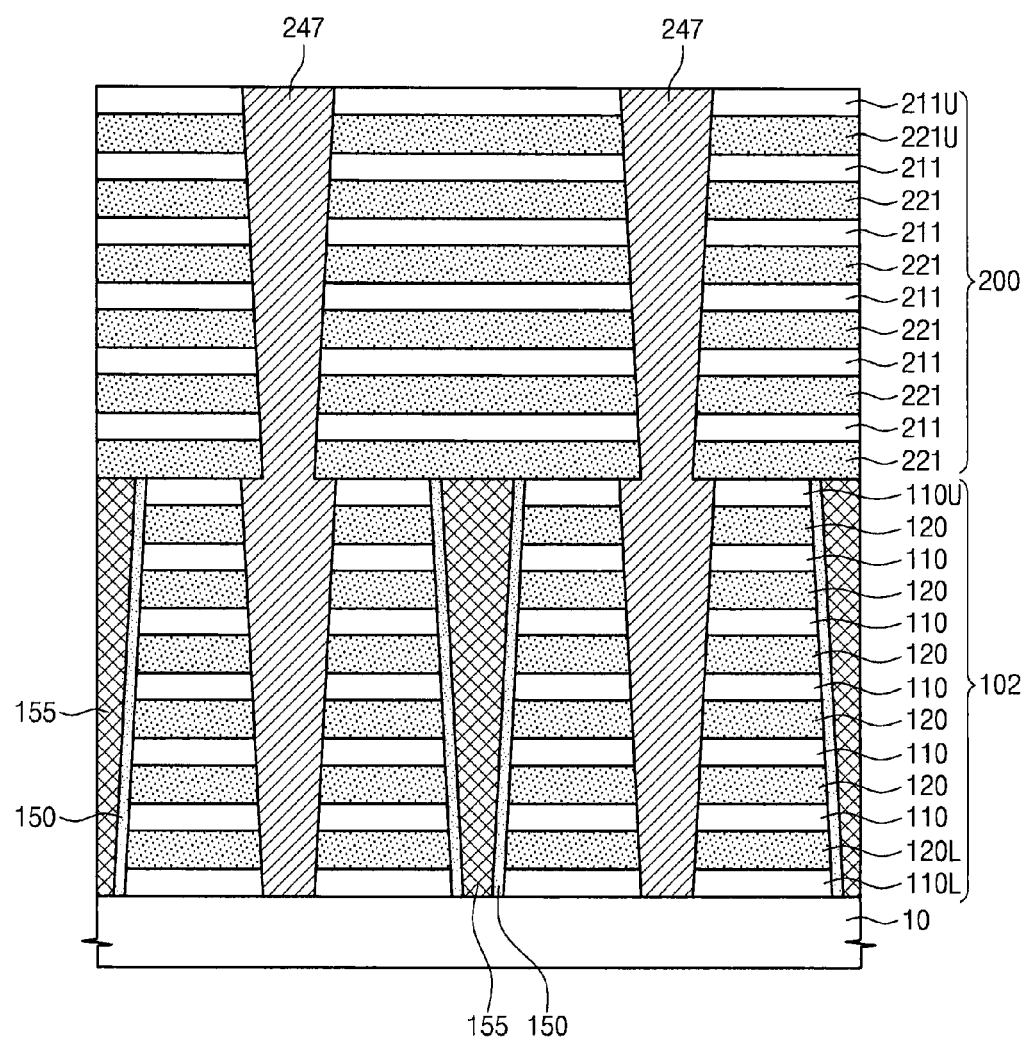

FIG. 29 is a cross-sectional diagram illustrating an example active pattern in a three-dimensional semiconductor device according to example embodiments of the inventive concepts. Referring to FIG. 29, an active pattern 247 may be formed to fill the first and second through-holes 130 and 230 entirely. The upper surface of the active pattern 247 may be at the same level as the upper surface of the second stack pattern 202. Forming the active pattern 247 may be performed by, for example, epitaxial technology, an atomic layer deposition process and/or a chemical vapor deposition process. The active pattern 247 may be formed of a semiconducting material. For example, the active pattern 247 may include silicon, and the crystal structure may be polycrystalline, single crystalline and/or amorphous.

Figure 30:
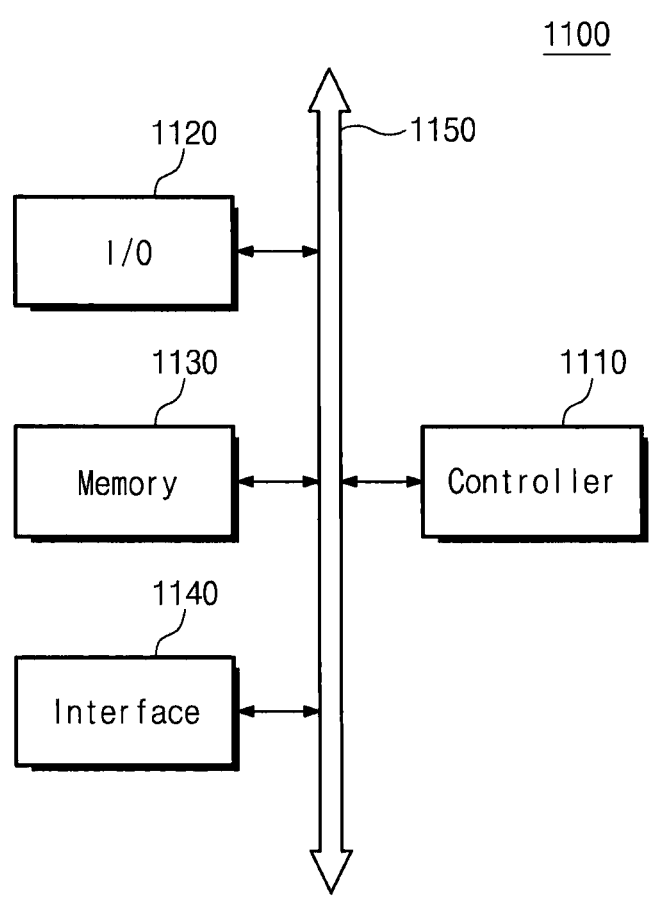

FIG. 30 is a schematic block diagram illustrating example electronic systems including three-dimensional semiconductor devices manufactured according to example embodiments of the inventive concepts. Referring to FIG. 30, an electronic system 1100 according to one or more example embodiments of the inventive concepts may include a controller 1110, an input/output device (I/O) 1120, a memory device 1130, an interface 1140 and/or a bus 1150. The controller 1110, the input/output device 1120, the memory device 1130 and/or the interface 1140 may communicate with each other through the bus 1150. The bus 1150 may facilitate data transfer.

The controller 1110 may include at least one of micro processors, a digital signal processor, a micro controller and/or other logic devices capable of performing similar functions. The input/output device 1120 may include, for example, a keypad, a keyboard and/or a display device. The memory device 1130 may store data and/or commands. The memory device 1130 may include at least one of the three-dimensional semiconductor devices described with respect to FIGS. 1-29. The memory device 1130 may include other types of semiconductor memory devices (e.g., a dynamic random access memory (DRAM) device and/or a static random access memory (SRAM) device, etc.). The interface 1140 may act to dispatch data to a communication network and/or to receive data from the network.

The interface 1140 may be a wired or wireless type. For example, the interface 1140 may include an antenna and/or a wire/wireless transceiver. Although not shown in the drawings, the electronic system 1100 may further include a high-speed DRAM device and/or a SRAM device as an operation memory device for improving the operation of the controller 1110. The electronic system 1100 may be part of a personal digital assistant (PDA), a portable computer, a web tablet, a wireless phone, a mobile phone, a digital music player, a memory card and/or all electronic products capable of transmitting and/or receiving data in a wireless environment.

Figure 31:
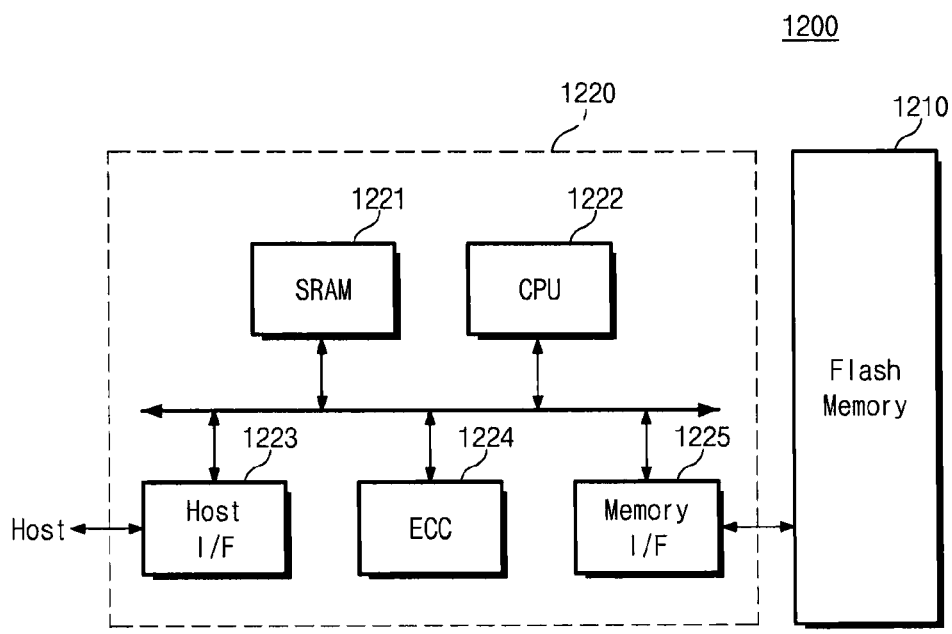

FIG. 31 is a schematic block diagram illustrating example memory cards including three-dimensional semiconductor devices manufactured according to example embodiments of the inventive concepts. Referring to FIG. 31, a memory card 1200 according to one or more example embodiments of the inventive concepts may include a memory device 1210. The memory device 1210 may include at least one of the three-dimensional semiconductor devices described with respect to FIGS. 1-29. The memory device 1210 may include other types of semiconductor memory devices (e.g., a dynamic random access memory (DRAM) device and/or a static random access memory (SRAM) device, etc.). The memory card 1200 may include a memory controller 1220 to control data exchanges between a host and the memory device 1210. The memory controller 1220 may include a processing unit 1222 to control overall operation of the memory card 1200.

The memory controller 1220 may include a SRAM 1221 used as an operation memory of the processing unit 1222. The memory controller 1220 may include a host interface 1223 and a memory interface 1225. The host interface 1223 may include a data exchange protocol used between the memory card 1200 and the host. The memory interface 1225 may contact the memory controller 1220 and the memory device 1210. The memory controller 1220 may include an error correction code (ECC) 1224. The error correction code 1224 may detect and correct data read out error from the memory device 1210. Although not shown in the drawings, the memory card 1200 may include a read only memory (ROM) device to store code for interfacing with the host. The memory card 1200 may be used as a portable data storage card. The memory card 1200 may be a solid state disk (SSD) capable of replacing the hard disk of a computer system.

Figure 32:
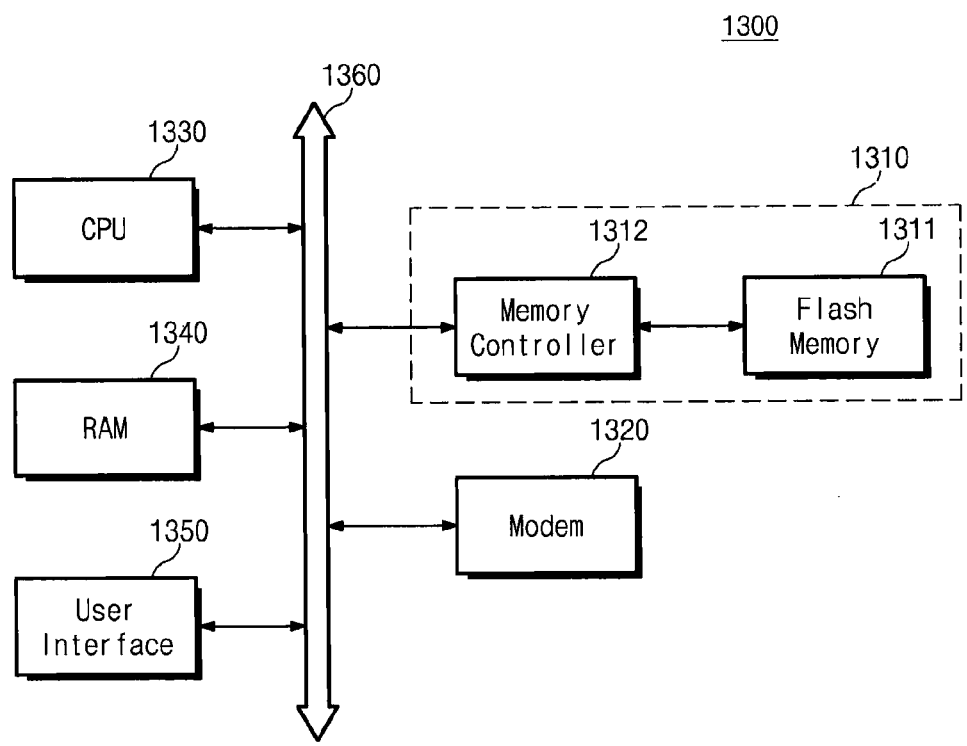

FIG. 32 is a schematic block diagram illustrating example data processing systems mounting three-dimensional semiconductor devices manufactured according to example embodiments of the inventive concepts. Referring to FIG. 32, a flash memory system 1310 according to example embodiments of the inventive concepts may be mounted in a data processing system 1300 (e.g., a mobile device or a desktop computer). A data processing system 1300 according to example embodiments of the inventive concepts may include the flash memory system 1310, a modem 1320, a central processing unit 1330, a random access memory (RAM) 1340 and a user interface 1350 which are electrically connected to a system bus 1360.

The flash memory system 1310 may include the electronic systems and/or the memory cards described with respect to FIGS. 30 and 31. In the flash memory system 1310, the data processed by the central processing unit 1330 and/or the data input from the outside may be stored. The flash memory system 1310 may be a solid state disk (SSD), and in this case, the data processing system 1300 may stably store a high volume of data in the flash memory system 1310. Due to increased and/or improved reliability, the flash memory system 1310 may reduce the resources required for error correction, thereby providing a high-speed data exchange function to the data processing system 1300. Although not shown in the drawings, it is obvious to those skilled in the art that the data processing system 1300 according to example embodiments of the inventive concepts may be supplied with an application chipset, a camera image processor (CIS), an input/out device and/or the like.

A flash memory device and/or a memory system according to example embodiments of the inventive concepts may be mounted to various types of packages. For example, the flash memory device and/or the memory system according to example embodiments of the inventive concepts may be mounted by being packaged, for example, in package types such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), wafer-level processed stack package (WSP) and/or the like.

According to example embodiments of the inventive concepts, in order to form a three-dimensional semiconductor device, depositing a plurality of layers and forming openings passing through the layers may be repeatedly performed many times. Spacers may be formed on the sidewalls formed by layers inside the respective openings to prevent or reduce damage to the layers during processing. Therefore, three-dimensional semiconductor devices with improved reliability and electrical characteristics may be realized.

While example embodiments have been particularly shown and described, it will be understood by one of ordinary skill in the art that variations in form and detail may be made therein without departing from the spirit and scope of the claims.

What is claimed is:

1. A method of manufacturing a three-dimensional semiconductor device, the method comprising:
   forming a first stack structure on a substrate;
   forming a first opening passing through the first stack structure;
   forming a first spacer on a sidewall of the first stack structure inside the first opening;
   forming a sacrificial filling pattern to fill the first opening;
   forming a second stack structure on the first stack structure;
   forming a second opening passing through the second stack structure to expose the sacrificial filling pattern;
   forming a second spacer on a sidewall of the second stack structure inside the second opening;
   removing the sacrificial filling pattern; and
   removing the first and second spacers.

2. The method of claim 1, wherein the first and second spacers include a material with etch selectivity to the sacrificial filling pattern.

3. The method of claim 1, further comprising:
   forming an etch stop layer on the second stack structure prior to the forming of the second opening,
   wherein the forming of the second opening includes forming the second opening to pass through the etch stop layer and the second stack structure.

4. The method of claim 3, wherein a material of the etch stop layer is the same as a material of at least one of the first and second spacers.

5. The method of claim 1, wherein the forming of the first opening and the forming of the second opening include forming the first and second openings in trench shapes extending in one direction.

6. The method of claim 5, further comprising:
   forming a first active pattern passing through the first stack structure before the forming of the first opening; and
   forming a second active pattern passing through the second stack structure to contact the first active pattern before the forming of the second opening.

7. The method of claim 6, further comprising:
   forming empty regions between a plurality of insulation layers by removing a plurality of sacrificial layers exposed in the first and second openings after the removing of the first and second spacers;
   forming a data storage layer conformally on surfaces inside the empty regions; and
   forming gate patterns on the data storage layer to fill the empty regions,
   wherein the forming of the first stack structure and the forming of the second stack structure include alternating the insulation layers with the sacrificial layers, and
   the insulation layers include a material with etch selectivity to the sacrificial layers.

8. The method of claim 7, wherein the first spacer and the second spacer include a material with etch selectivity to the insulation layers.

9. The method of claim 5, further comprising:
   forming a first through-hole passing through the first stack structure before the forming of the second stack structure, the first through-hole spaced apart from the first opening;
   forming a first hole spacer on a sidewall of the first stack structure inside the first through-hole;
   forming a hole fill pattern on the first hole spacer to fill the first through-hole;
   forming a second through-hole passing through the second stack structure to expose the hole fill pattern;
   forming a second hole spacer on a sidewall of the second stack structure in the second through-hole;
   removing the exposed hole fill pattern to expose the first hole spacer;
   removing the first and second hole spacers; and
   forming an active pattern in the first and second through-holes.

10. The method of claim 9, further comprising:
forming empty regions between a plurality of insulation layers by removing a plurality of sacrificial layers exposed in the first and second openings after the removing of the first and second spacers;
forming a data storage layer conformally on surfaces of the first and second stack structures inside the empty regions; and
forming gate patterns on the data storage layer to fill the empty regions,
wherein the forming of the first stack structure and the forming of the second stack structure include alternating the insulation layers and the sacrificial layers, and
the insulation layers includes a material with etch selectivity to the sacrificial layers.

11. The method of claim 10, wherein the first hole spacer and the second hole spacer each include at least one material with etch selectivity to the insulation layers and the sacrificial layers.

12. The method of claim 10, wherein the first and second hole spacers and the first and second spacers are formed of different materials.

13. The method of claim 10, wherein the forming of the first opening and the forming of the first through-hole include forming the first opening and the first through-hole at a same time.

14. The method of claim 1, further comprising:
forming an active pattern in the first and second openings after the removing of the first and second spacers,
wherein the forming of the first opening includes forming the first opening in a hole shape in the first stack structure, and
the forming of the second opening includes forming the second opening in a hole shape in the second stack structure.

15. The method of claim 6, further comprising:
forming first and second insulating buried patterns on the first and second active patterns, respectively, to fill the first and second through-holes.

16. The method of claim 15, further comprising:
forming a conductive pad between the first and second buried patterns to connect the first and second active patterns.

17. The method of claim 9, further comprising:
forming an insulating buried pattern on the active pattern to fill the first and second through-holes; and
forming a pad on the buried pattern in contact with the active pattern.

18. A method of manufacturing a three-dimensional semiconductor device, the method comprising:
depositing a first plurality of layers on a semiconductor layer, the first plurality of layers including a first layer and a second layer;
removing a portion of the first and second layers to form a single first sidewall;
depositing a first spacer on the first sidewall;
depositing a sacrificial layer on the first spacer such that an exposed surface of the plurality of layers is contiguous;
depositing a second plurality of layers on the first plurality of layers, the second plurality of layers including a third layer and a fourth layer;
removing a portion of the third and fourth layers to form a single second sidewall and to expose the sacrificial layer;
depositing a second spacer on the second sidewall;
removing the sacrificial layer; and
removing the first and second spacers.

* * * * *